(12) United States Patent
Koitabashi et al.

(10) Patent No.: US 8,343,694 B2
(45) Date of Patent: Jan. 1, 2013

(54) PHOTOMASK BLANK, RESIST PATTERN FORMING PROCESS, AND PHOTOMASK PREPARATION PROCESS

(75) Inventors: Ryuji Koitabashi, Joetsu (JP); Satoshi Watanabe, Joetsu (JP); Takanobu Takeda, Joetsu (JP); Keiichi Masunaga, Joetsu (JP); Tamotsu Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/207,764

(22) Filed: Aug. 11, 2011

(65) Prior Publication Data

US 2011/0294047 A1    Dec. 1, 2011

Related U.S. Application Data

(62) Division of application No. 12/129,975, filed on May 30, 2008, now abandoned.

(30) Foreign Application Priority Data

Jun. 6, 2007    (JP) .................................. 2007-150130

(51) Int. Cl.
*G03F 9/00*    (2006.01)

(52) U.S. Cl. ......... 430/5; 430/270.1; 430/313; 430/326; 430/907

(58) Field of Classification Search .............. 430/5, 313, 430/326, 907, 270.1
See application file for complete search history.

(56) References Cited

U.S. PATENT DOCUMENTS

| | | | |
|---|---|---|---|
| 6,136,502 A | 10/2000 | Satoshi et al. | |
| 6,414,101 B1 | 7/2002 | Watanabe et al. | |
| 7,189,492 B2 * | 3/2007 | Kodama et al. | 430/270.1 |
| 7,291,441 B2 | 11/2007 | Sato | |
| 7,312,016 B2 | 12/2007 | Koitabashi et al. | |
| 7,635,554 B2 * | 12/2009 | Fukuhara et al. | 430/270.1 |
| 7,642,034 B2 | 1/2010 | Hatakeyama et al. | |
| 7,771,913 B2 | 8/2010 | Kaneko et al. | |
| 7,799,507 B2 | 9/2010 | Endo et al. | |
| 8,034,537 B2 * | 10/2011 | Fukuhara et al. | 430/270.1 |
| 2003/0078352 A1 | 4/2003 | Miyazawa et al. | |
| 2003/0224283 A1 | 12/2003 | Allen et al. | |
| 2005/0233245 A1 | 10/2005 | Koitabashi et al. | |
| 2006/0008736 A1 | 1/2006 | Kanda et al. | |
| 2006/0088774 A1 | 4/2006 | Yoshikawa et al. | |
| 2007/0082289 A1 * | 4/2007 | Wada | 430/270.1 |
| 2007/0099114 A1 | 5/2007 | Watanabe et al. | |
| 2007/0105038 A1 | 5/2007 | Takeshita et al. | |
| 2007/0166639 A1 | 7/2007 | Araki et al. | |
| 2007/0178405 A1 | 8/2007 | Kanda et al. | |
| 2008/0063950 A1 | 3/2008 | Yoshikawa et al. | |

FOREIGN PATENT DOCUMENTS

| | | |
|---|---|---|
| EP | 1764652 A2 | 3/2007 |
| EP | 1804120 A1 | 7/2007 |
| EP | 1850372 A1 | 10/2007 |
| JP | 11-190904 A | 7/1999 |
| JP | 2000-344836 A | 12/2000 |
| JP | 2002-220416 A | 8/2002 |
| JP | 2003-068633 A | 3/2003 |
| JP | 2005-164633 A | 6/2005 |
| JP | 2005-326833 A | 11/2005 |
| JP | 2006-048029 A | 2/2006 |
| JP | 2006-078807 A | 3/2006 |
| JP | 2006-091830 A | 4/2006 |
| JP | 2006-146151 A | 6/2006 |
| JP | 2006-228816 A | 8/2006 |
| JP | 2006-287236 A | 10/2006 |
| WO | 2005-073812 A1 | 8/2005 |
| WO | 2007-030918 A1 | 3/2007 |

OTHER PUBLICATIONS

Japanese Office Action dated Nov. 17, 2009, issued in corresponding Japanese Patent Application No. 2007-150130.
European Search Report dated Sep. 16, 2008, issued in corresponding European Patent Application No. 08010295.7.
Chinese Office Action dated Apr. 27, 2012, issued in corresponding Chinese Patent Application No. 200810154778.2 (10 pages).

* cited by examiner

*Primary Examiner* — John Chu
(74) *Attorney, Agent, or Firm* — Westerman, Hattori, Daniels & Adrian, LLP

(57) ABSTRACT

A photomask blank has a resist film comprising (A) a base resin, (B) an acid generator, and (C) a basic compound. The resist film further comprises (D) a polymer comprising recurring units having a side chain having a fluorinated hydrocarbon group which contains a carbon atom to which a hydroxyl group is bonded and vicinal carbon atoms bonded thereto, the vicinal carbon atoms having in total at least two fluorine atoms bonded thereto. Addition of polymer (D) ensures uniform development throughout the resist film, enabling to form a resist pattern having high CD uniformity.

6 Claims, No Drawings

PHOTOMASK BLANK, RESIST PATTERN FORMING PROCESS, AND PHOTOMASK PREPARATION PROCESS

CROSS-REFERENCE TO RELATED APPLICATIONS

This application is a Divisional of application Ser. No. 12/129,975, filed May 30, 2008 which claims priority under 35 U.S.C. §119(a) on Patent Application No. 2007-150130 filed in Japan on Jun. 6, 2007, the entire contents of which are hereby incorporated by reference.

TECHNICAL FIELD

This invention relates to a process for forming a resist pattern by lithography using high-energy radiation such as UV, deep-UV, electron beam, x-ray, excimer laser, gamma-ray or synchrotron radiation, and especially beam lithography, a process for preparing a photomask using the resist pattern formed thereby, and a photomask blank having a chemically amplified positive resist film deposited thereon to which the foregoing processes are advantageously applicable so that the blank is processed into a photomask.

BACKGROUND ART

The recent trend toward higher integration in the integrated circuit technology poses a demand for finer feature size patterns. Acid-catalyzed chemically amplified resists are thought promising to this end. The light source used for exposure of these resists is most often high-energy radiation such as electron beam, x-ray, excimer laser, gamma-ray or synchrotron radiation. In particular, the electron beam lithography is of interest as the lithography capable of micropatterning to an extremely fine size of 0.1 micron or less. The EB lithography is also regarded essential for forming a pattern on a photomask which serves as a master for pattern exposure.

This image writing with an electron beam takes a time as compared with the full exposure by photolithography employing a photomask. While sensitivity enhancement is required in order to gain an increased throughput, the mask pattern formation requires more accurate control of line width because the photomask serves as a master during semiconductor manufacture. A tradeoff arises between these problems. In particular, it is difficult to control the in-plane uniformity of line width (CD uniformity) because the CD uniformity can be affected by almost all steps (e.g., resist coating, storage after coating, EB image writing, PEB, development, and etching) involved in the mask fabrication. Then for the advanced mask blanks, it is crucial that the blank be coated with a resist which is substantially insensitive to the process, that is, improved in pre-baking temperature dependence after coating, storage stability after coating, age stability in vacuum after image writing, heating temperature dependence after irradiation, and development dependence.

Known methods for forming a resist pattern while insuring the in-plane uniformity of line width include approaches from process and resist aspects. The improvement-by-process is described in JP-A 2006-228816 and JP-A 2003-68633. The approaches from the resist composition aspect include control of glass transition point of a base polymer as disclosed in JP-A 2005-164633, and inclusion of specific recurring units in a base polymer as disclosed in JP-A 2006-91830.

DISCLOSURE OF THE INVENTION

An object of the invention is to provide a process for forming a resist pattern by lithography, especially electron beam lithography, requiring high-accuracy formation of a fine feature pattern, the process clearing the requirements of sensitivity, resolution and age stability at high levels and forming a resist pattern with improved in-plane uniformity of line width; a process for preparing a photomask using the resist pattern formed thereby; and a photomask blank having a chemically amplified positive resist film deposited thereon to which the foregoing processes are advantageously applicable so as to form a resist pattern and to process the blank into a photomask.

As compared with a resist film on a workpiece such as a wafer, that is, a resist film to which a mask pattern is transferred through a photomask, a resist film deposited on a photomask blank, that is, a resist film used when a photomask blank is processed into a photomask that serves as a master for pattern transfer to a workpiece (pattern-receiving object) is required to have a high accuracy sufficient to write a finer size pattern, specifically high in-plane uniformity of line width because it is a resist film used for forming a master for pattern transfer. The inventor made investigations how to achieve a high accuracy in the process for forming a pattern in a resist film adapted for use in processing of such photomask blanks.

It is indicated in JP-A 2006-48029 and some other patents that a polymer having a hydroxyl-bearing substituent group in which hydrocarbon groups vicinal to the carbon atom to which the hydroxyl group is bonded have fluorine atoms substituted for hydrogen atoms so that the substituent group has a higher acidity can be used in a resist composition adapted for immersion lithography as an effective component for preventing the ingredients in the resist film from being leached out of the resist film surface. The immersion lithography is designed such that an enhanced resolution performance is accomplished by increasing the incident angle of light, and used in repeatedly transferring a pattern to a resist film on a workpiece such as a wafer using the photomask as a master.

On the other hand, the immersion lithography is not used in the fabrication of a photomask where a pattern is directly written on a resist film on a photomask blank using a beam of high-energy radiation. In the lithography using no liquid where there is no concern about leaching of components in the resist film into the liquid, no attempt has been made to use as the resist material the polymer suited in the immersion lithography.

The inventor attempted to form a resist film for use in processing of a photomask blank from a polymer of the above-identified type and to apply it to lithography using electron beam irradiation. The inventor has then found that better performance is achieved when a polymer having a hydroxyl-bearing substituent group in which hydrocarbon groups vicinal to the carbon atom to which the hydroxyl group is bonded have fluorine atoms substituted for hydrogen atoms so that the substituent group has a higher acidity is added to a resist composition of selected components. Specifically, as compared with the resist composition of selected components and free of the specific polymer, the resist composition having added thereto the specific polymer capable of increasing the contact angle with neutral water of a resist film thereof in the unexposed state can improve the in-plane uniformity of line width of a resist pattern resulting from patterning of the resist film and satisfy both a high throughput and a high accuracy of mask pattern formation when a photomask blank is processed into a photomask using the resist pattern, and particularly when a photomask is prepared by direct writing on the resist film with a beam of high-energy radiation.

Accordingly, the present invention provides a photomask blank, a resist pattern forming process, and a photomask preparing process, as defined below.

[1] A photomask blank comprising a resist film deposited thereon, said resist film comprising (A) a base resin which is insoluble in an aqueous alkaline solution, but turns to be soluble in an aqueous alkaline developer under the action of an acid, (B) an acid generator, (C) a basic compound, and (D) a polymer comprising first recurring units having a side chain having a first fluorinated hydrocarbon group bearing a hydroxyl group which contains the carbon atom to which the hydroxyl group is bonded and vicinal carbon atoms bonded thereto, the vicinal carbon atoms having in total at least two fluorine atoms bonded thereto.

[2] The photomask blank of [1] wherein the polymer (D) functions such that the contact angle with neutral water of a resist film comprising components (A) to (D) is larger than the contact angle of a resist film comprising components (A) to (C) and free of component (D).

[3] The photomask blank of [1] or [2] wherein the base resin (A) comprises recurring units having an aromatic structure.

[4] The photomask blank of any one of [1] to [3] wherein the polymer (D) includes main recurring units in which atoms forming the polymerized main chain are not part of a cyclic structure.

[5] The photomask blank of any one of [1] to [4] wherein the first recurring units of the polymer (D) have the general formula (1) or (2):

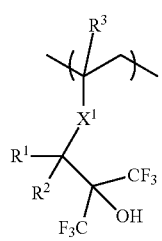

(1)

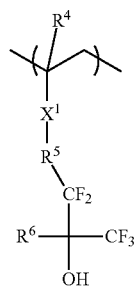

(2)

wherein $R^1$ and $R^2$ are each independently hydrogen or a straight, branched or cyclic $C_1$-$C_6$ alkyl group, or $R^1$ and $R^2$ may bond together to form a ring, a combination of $R^1$ and $R^2$ standing for a divalent organic group of 2 to 12 carbon atoms in total, $R^3$ and $R^4$ are each independently hydrogen or methyl, $R^5$ is a straight, branched or cyclic $C_1$-$C_6$ alkylene group in which at least one hydrogen atom may be substituted by a fluorine atom, $R^6$ is independently a straight or branched $C_1$-$C_{10}$ alkyl group in which at least one hydrogen atom is substituted by a fluorine atom, or $R^5$ and $R^6$ may bond together to form a ring, a combination of $R^5$ and $R^6$ standing for a trivalent organic group of 2 to 12 carbon atoms in total, and $X^1$ is —C(=O)—, —C(=O)—O—, —O—, —C(=O)—$R^7$—C(=O)—, or —C(=O)—O—$R^7$—C(=O)—O— wherein $R^7$ is a straight, branched or cyclic $C_1$-$C_{10}$ alkylene group.

[6] The photomask blank of any one of [1] to [5] wherein the polymer (D) further comprises second recurring units having a side chain having a second fluorinated hydrocarbon group different from the first fluorinated hydrocarbon group and free of the first fluorinated hydrocarbon group.

[7] The photomask blank of [6] wherein the second recurring units of the polymer (D) have the general formula (3):

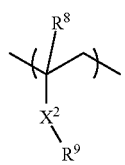

(3)

wherein $R^8$ is independently hydrogen or methyl, $R^9$ is a straight, branched or cyclic $C_1$-$C_{10}$ alkyl group in which at least one hydrogen atom is substituted by a fluorine atom, and $X^2$ is —C(=O)—, —C(=O)—O—, —O—, —C(=O)—$R^{10}$—C(=O)—, or —C(=O)—O—$R^{10}$—C(=O)—O— wherein $R^{19}$ is a straight, branched or cyclic $C_1$-$C_{10}$ alkylene group.

[8] The photomask blank of any one of [1] to [7] wherein a pattern is written on the resist film by electron beam lithography.

[9] A process for forming a resist pattern using a workpiece having a resist film deposited thereon, said resist film comprising (A) a base resin which is insoluble in an aqueous alkaline solution, but turns to be soluble in an aqueous alkaline developer under the action of an acid, (B) an acid generator, (C) a basic compound, and (D) a polymer comprising first recurring units having a side chain having a first fluorinated hydrocarbon group bearing a hydroxyl group which contains the carbon atom to which the hydroxyl group is bonded and vicinal carbon atoms bonded thereto, the vicinal carbon atoms having in total at least two fluorine atoms bonded thereto, said process comprising the steps of irradiating high-energy radiation to the resist film in the absence of a liquid, and developing the resist film with an aqueous alkaline developer.

[10] The process of [9] wherein the polymer (D) functions such that the contact angle with neutral water of a resist film comprising components (A) to (D) is larger than the contact angle of a resist film comprising components (A) to (C) and free of component (D).

[11] The process of [9] or [10] wherein the high-energy radiation is a high-energy beam.

[12] The process of [11] wherein the high-energy radiation is an electron beam.

[13] A process for preparing a photomask, comprising the steps of forming a resist pattern in accordance with the process of any one of [9] to [12] wherein the workpiece is a photomask blank, and etching the photomask blank through the resist pattern as an etching mask.

The photomask blank of the invention has the advantage that a resist film thereon is patterned to form a resist pattern having a high in-plane uniformity of line width. The photomask blank can satisfy both a high throughput and a high accuracy of mask pattern formation when the photomask blank is processed into a photomask using the resist pattern, especially when a photomask is prepared by direct writing on the resist film with a beam of high-energy radiation. As compared with a mask blank having a resist film free of the polymer as component (D) (i.e., a resist film having a relatively small contact angle with neutral water), the inventive mask blank has the advantage that a resist pattern obtained after irradiation of high-energy radiation and development in an aqueous alkaline solution is significantly improved in in-plane uniformity of line width.

The preferred component (A) is a base resin comprising recurring units having an aromatic structure. Inclusion of aromatic units provides the resist with high dry etch resistance during etching of the photomask blank.

The preferred polymer as component (D) is composed of main recurring units in which atoms forming the polymerized main chain are not part of a cyclic structure. Addition of this polymer has little influence on resolution as compared with polynorbornene resins, ROMP (ring-opening metathesis polymer) resins and similar resins having a cyclic structure in the main chain.

Illustrative preferred examples of component (D) include polymers comprising recurring units having formula (1) or (2). Addition of a polymer having such a structure is expected to be effective to CD uniformity and also effective in achieving a high resolution and preventing scum generation.

The preferred polymer as component (D) further comprises second recurring units having a side chain which has a second fluorinated hydrocarbon group different from the first fluorinated hydrocarbon group and is free of the first fluorinated hydrocarbon group. Inclusion of the second recurring units and optionally recurring units of formula (3) in the polymer as component (D) is effective in increasing the contact angle with neutral water of a resist film containing the first recurring units, and even when too high a dissolution rate results from a choice of first recurring units, is also effective in tailoring the solubility in a developer so as to prevent the pattern profile from being degraded by polymer (D) during development.

The photomask blank is best suited when a pattern is written on the resist film by electron beam lithography. In this embodiment, the content of acid generator (B) should be adjusted for the electron beam lithography so as to provide a high sensitivity during pattern irradiation with an electron beam.

The resist pattern forming process of the invention is capable of forming a resist pattern with high in-plane uniformity of line width on a workpiece, when applied to the electron beam lithography and other lithography using high-energy radiation such as x-ray, γ-ray or synchrotron radiation, typically SCALPEL (scattering with angular limitation projection electron-beam lithography or charged particle beam projection). As compared with a mask blank having a resist film free of the polymer as component (D) (i.e., a resist film having a relatively small contact angle with neutral water), the resist film used in the process is advantageous in that a resist pattern obtained after pattern irradiation and development in an aqueous alkaline solution is significantly improved in in-plane uniformity of line width. The resist pattern forming process of the invention is generally applicable to the lithography wherein high-energy radiation is irradiated in the absence of liquid.

One exemplary irradiation of high-energy radiation in the absence of liquid is beam irradiation, and typically electron beam irradiation. Since the EB lithography is effective in forming a small number of variable patterns as in the case of photomasks, it is advantageously applicable to the resist pattern forming process of the invention.

Also, the resist pattern forming process of the invention is suited in forming a resist pattern from a resist film deposited on a photomask blank as a typical workpiece. By etching the photomask blank through the resist pattern resulting from the process as an etching mask, a photomask with a high in-plane accuracy can be produced.

BENEFITS OF THE INVENTION

The resist film having the polymer (D) added thereto has the advantage that upon resist pattern formation, uniform development prevails throughout the resist film so that a resist pattern having high in-plane uniformity of line width is formed at the end of development. From a photomask blank bearing the resist film having the polymer (D) added thereto, a photomask with a high in-plane accuracy can be produced following patterning of the resist film.

DESCRIPTION OF THE PREFERRED EMBODIMENT

In the specification, the singular forms "a," "an" and "the" include plural referents unless the context clearly dictates otherwise. The notation (Cn-Cm) means a group containing from n to m carbon atoms per group.

A resist film is deposited on a photomask blank according to the invention. This resist film comprises (A) a base resin which is insoluble in an aqueous alkaline solution, but turns to be soluble in an aqueous alkaline developer under the action of an acid, (B) an acid generator, and (C) a basic compound. The invention is characterized in that the resist film further comprises (D) a polymer comprising first recurring units having a side chain having a first fluorinated hydrocarbon group bearing a hydroxyl group which contains the carbon atom to which the hydroxyl group is bonded and vicinal carbon atoms bonded thereto, the vicinal carbon atoms having in total at least two fluorine atoms bonded thereto. A photomask blank having such a resist film deposited thereon is contemplated.

Component D

The polymer (D), specifically the polymer (D) which functions such that the contact angle with neutral water of a resist film comprising components (A) to (D) is larger than the contact angle of a resist film comprising components (A) to (C) and free of component (D) is used as one component of the resist composition to be applied to a photomask blank. The polymer (D) serves to increase the contact angle with pure water of the resist film without exacerbating the pattern profile, resulting in improved in-plane uniformity of line width (or CD uniformity) at the end of mask fabrication.

In a preferred embodiment, the polymer (D) which is a characteristic component of the invention is one comprising main recurring units in which the main chain portion has a chain structure, that is, atoms forming the polymerized main chain are not part of a cyclic structure, whereby any detrimental effect on resist resolution is eliminated. While COMA polymers and ROMP polymers containing many cyclic structures in the main chain, for example, have high etch resistance, they can reduce resolution and are difficult to optimize. Specifically, constituent units in which the main chain is chainlike account for preferably at least 80%, and more preferably at least 95%. It is further preferred that a chain structure other than by-product be not included in the main chain.

The essential recurring units in the polymer (D) are first recurring units having a side chain having a first fluorinated hydrocarbon group bearing a hydroxyl group which contains the carbon atom to which the hydroxyl group is bonded and vicinal carbon atoms bonded thereto, the vicinal carbon atoms having in total at least two fluorine atoms bonded thereto. The first recurring units function to increase the contact angle with neutral water and are also necessary to acquire a solubility in an aqueous alkaline developer so as to prevent the polymer from leaving scum.

Examples of the first recurring units include recurring units having the general formula (1) or (2).

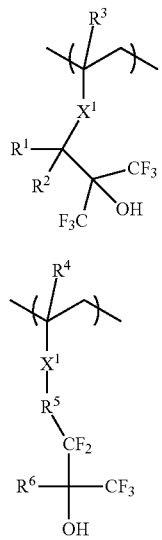

(1)

(2)

Herein $R^1$ and $R^2$ are each independently hydrogen or a straight, branched or cyclic $C_1$-$C_6$ alkyl group, or $R^1$ and $R^2$ may bond together to form a ring. In this case, a combination of $R^1$ and $R^2$ stands for a divalent organic group of 2 to 12 carbon atoms in total (e.g., straight, branched or cyclic saturated hydrocarbon group). $R^3$ and $R^4$ are each independently hydrogen or methyl. $R^5$ is a straight, branched or cyclic $C_1$-$C_6$ alkylene group in which at least one hydrogen atom may be substituted by a fluorine atom, $R^6$ is independently a straight or branched $C_1$-$C_{10}$ alkyl group in which at least one hydrogen atom is substituted by a fluorine atom, or $R^5$ and $R^6$ may bond together to form a ring. In this case, a combination of $R^5$ and $R^6$ stands for a trivalent organic group of 2 to 12 carbon atoms in total (e.g., straight, branched or cyclic saturated hydrocarbon group in which at least one hydrogen atom may be substituted by a fluorine atom). $X^1$ is selected from —C(=O)—, —C(=O)—O—, —O—, —C(=O)—R$^7$—C(=O)—, and —C—(=O)—O—R$^7$—C—(=O)—O— wherein $R^7$ is a straight, branched or cyclic $C_1$-$C_{10}$ alkylene group.

Illustrative preferred examples of recurring units having formula (1) are shown below.

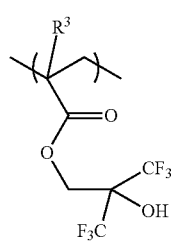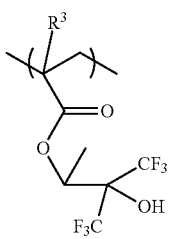

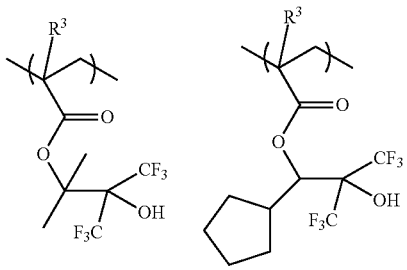

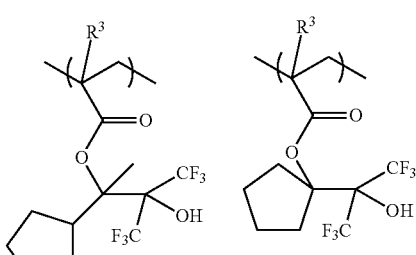

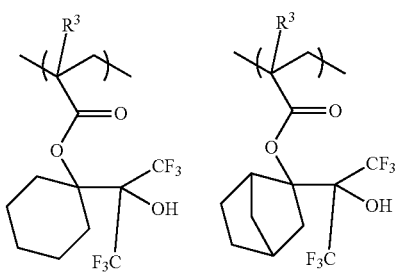

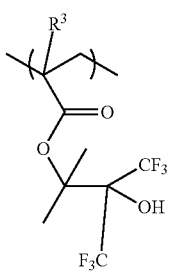

Herein $R^3$ is as defined above.

Illustrative preferred examples of recurring units having formula (2) are shown below.

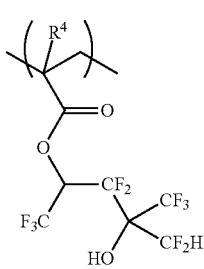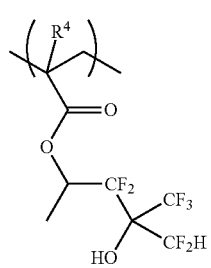

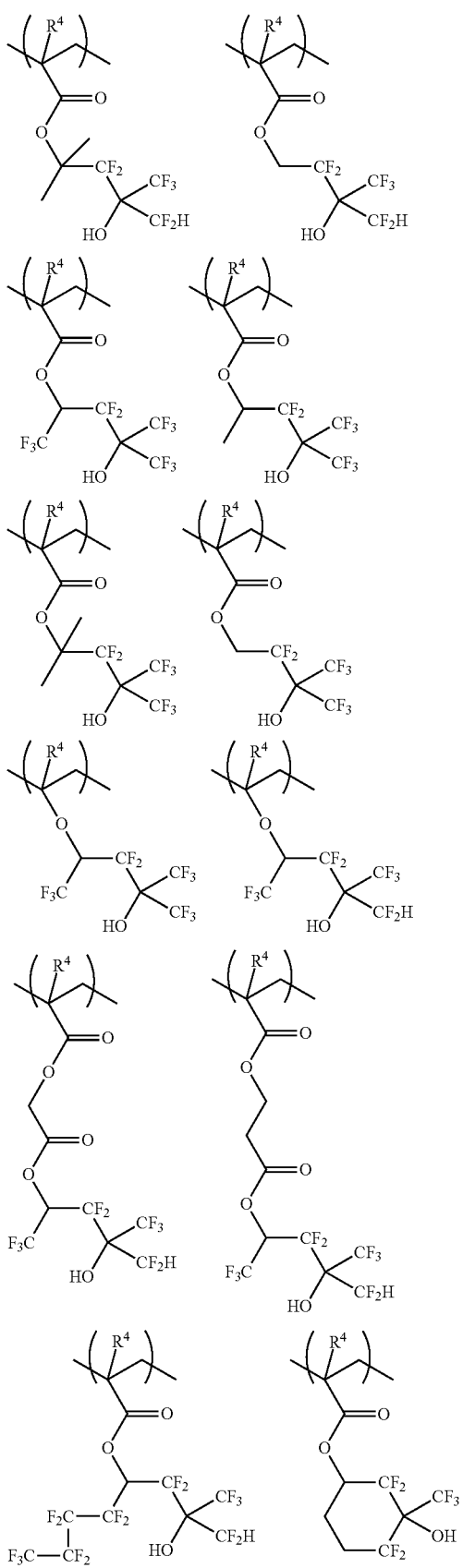

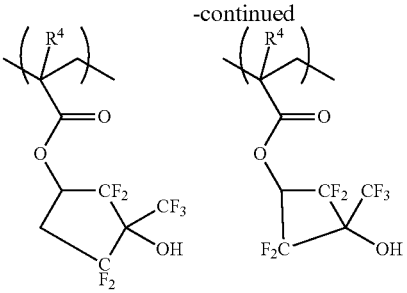

Herein R[4] is as defined above.

In the polymer (D), the first recurring units may be of a single type or a combination consisting of recurring units having formula (1), a combination consisting of recurring units having formula (2), or a combination of both recurring units having formulas (1) and (2).

In the polymer (D), the first recurring units are included in an amount of at least 30 mol %, preferably at least 40 mol %, and more preferably at least 50 mol % based on the entire recurring units while it is acceptable that the polymer consist of the first recurring units.

For better contact angle effect, it is preferred that the polymer (D) further comprise second recurring units having a side chain which has a second fluorinated hydrocarbon group different from the first fluorinated hydrocarbon group and is free of the first fluorinated hydrocarbon group.

Of the first recurring units, relatively small recurring units, i.e., recurring units having a total number of atoms which is relatively small are, for the most part, rather readily available. When such small recurring units are used in a large amount, the resulting polymer, if having a low molecular weight, can have too high a solubility in aqueous alkaline developer, detracting from the resolution of a resist film. This is also true for those recurring units having at least two hydroxyl groups, with fluorine atoms substituted at vicinal positions. Then, second recurring units having a side chain having a second fluorinated hydrocarbon group different from the first fluorinated hydrocarbon group and free of the first fluorinated hydrocarbon group are incorporated in the polymer (D) along with the first fluorinated hydrocarbon groups whereby the polymer (D) is tailored so as to enhance the contact angle effect without detracting from resolution.

Preferred as the second recurring units are recurring units having the general formula (3).

(3)

Herein R[8] is independently hydrogen or methyl, R[9] is a straight, branched or cyclic $C_1$-$C_{10}$ alkyl group in which at least one hydrogen atom is substituted by a fluorine atom, and $X^2$ is —C(=O)—, —C(=O)—O—, —O—, —C(=O)—R[10]—C(=O)—, or —C(=O)—O—R[10]—C(=O)—O— wherein R[10] is a straight, branched or cyclic $C_1$-$C_{10}$ alkylene group.

R[9] is selected from straight, branched or cyclic $C_1$-$C_{10}$ alkyl groups in which at least one hydrogen atom is substituted by a fluorine atom, preferably such groups having 2 to 10 carbon atoms and at least 3 fluorine atoms and more preferably such groups of straight or branched structure.

Suitable precursors from which the recurring units of formula (3) are derived include enone compounds, unsaturated esters, and unsaturated ethers. Those which are preferably selected from these are (meth)acrylates, typical examples of which are shown below.

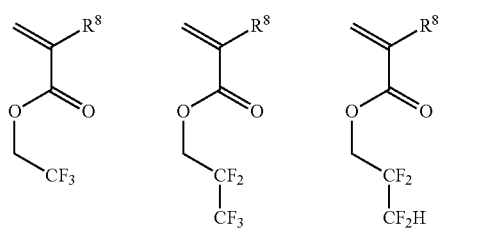

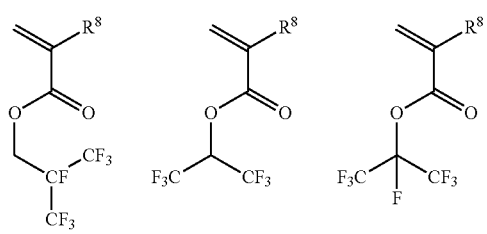

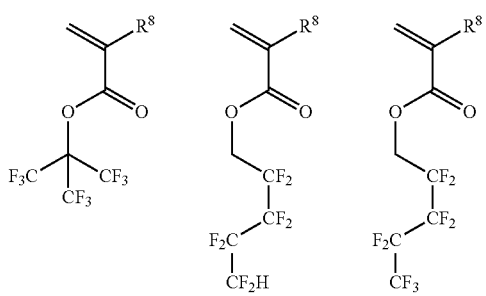

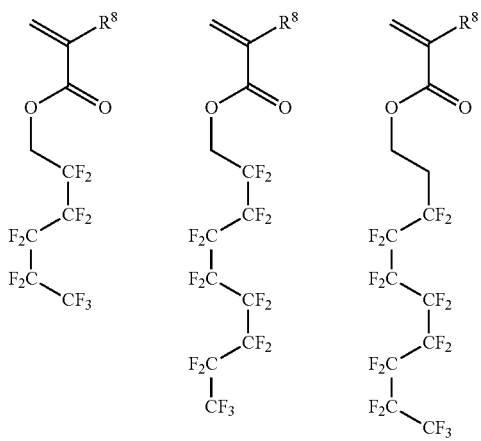

-continued

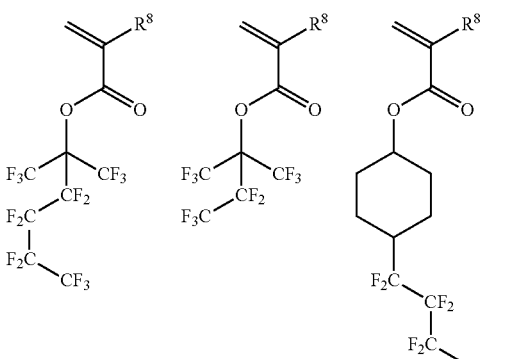

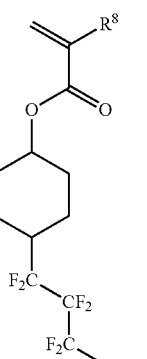

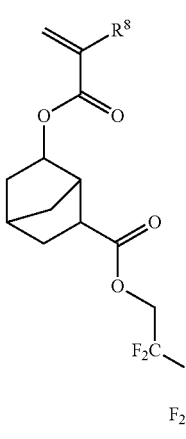

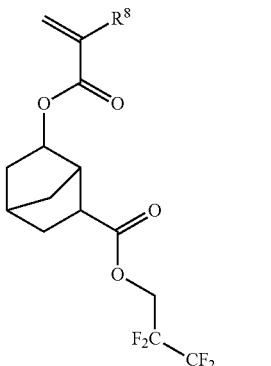

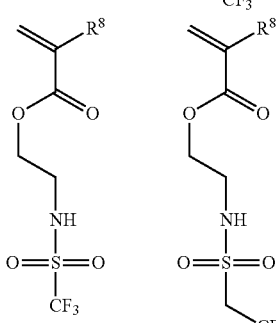

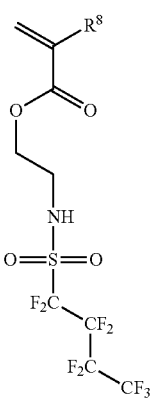

-continued
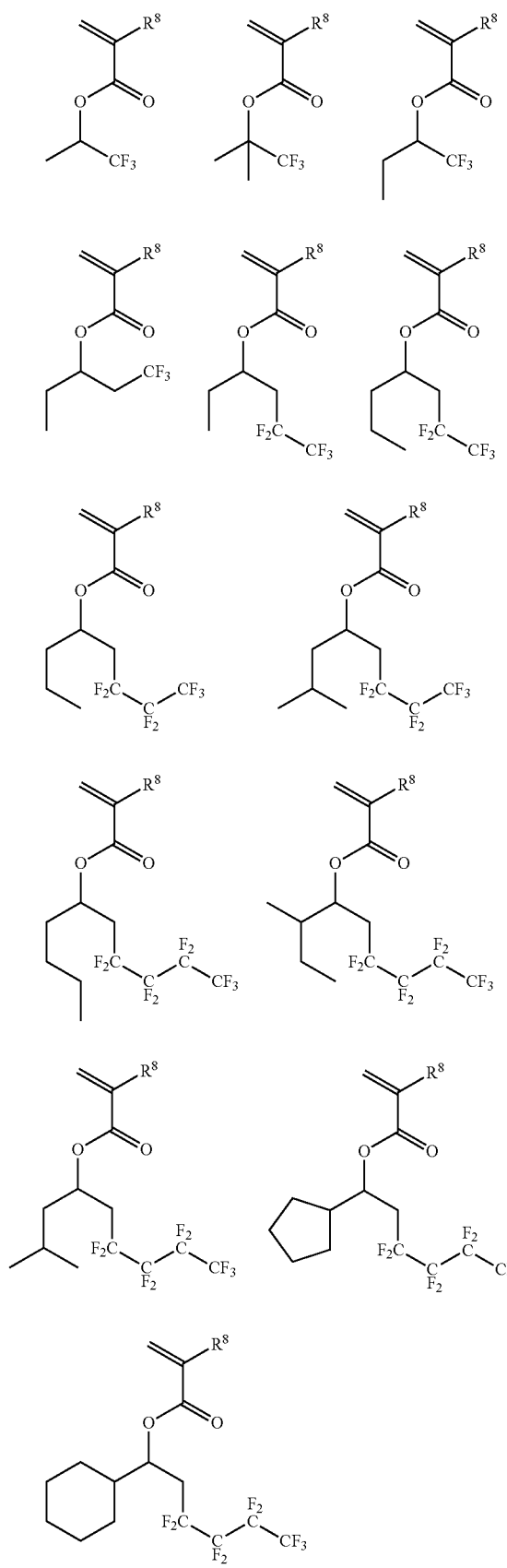
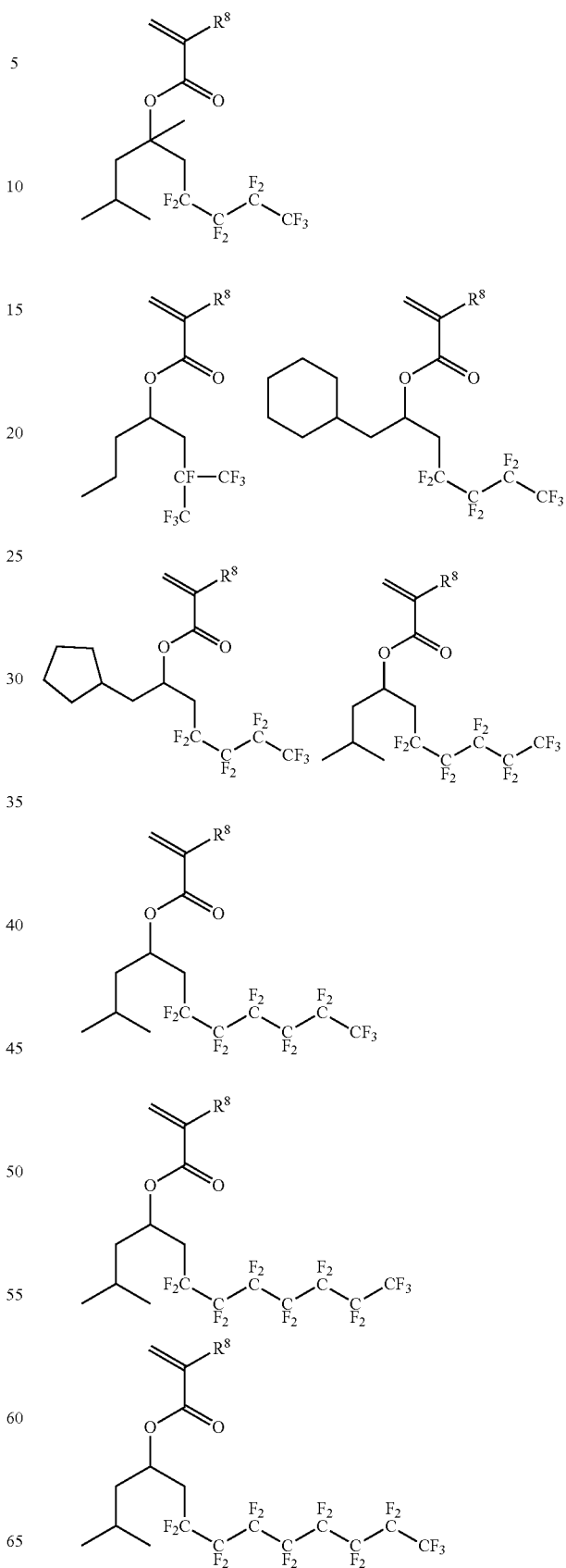

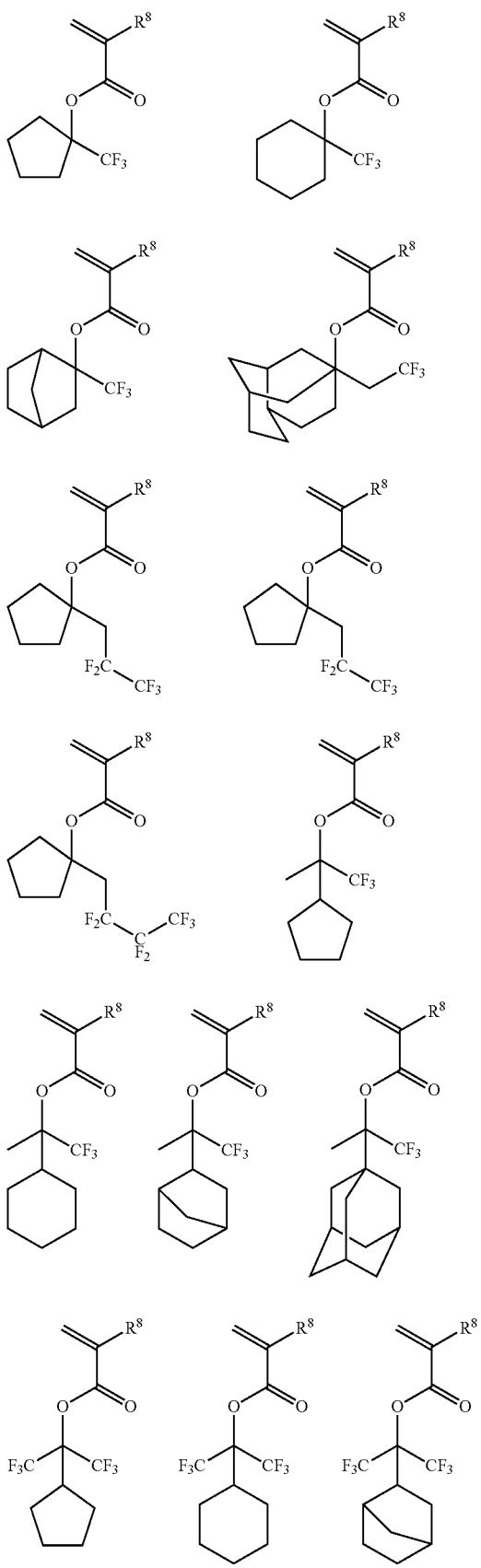
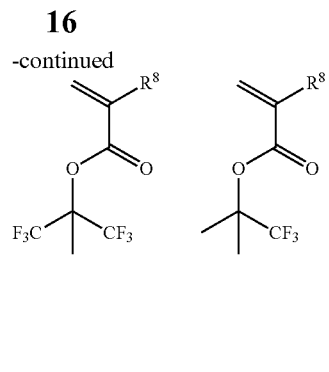

Herein $R^8$ is as defined above.

While inclusion of the second recurring units is not essential, the second recurring units, if used, are included in an amount of up to 60 mol %, and preferably up to 50 mol % based on the entire recurring units of the polymer (D), with the exact amount depending on the structure like a total number of atoms per recurring unit. Additionally, the second recurring units are preferably used in such amounts relative to the first recurring units that the molar ratio of second recurring units to first recurring units is up to 50/50, and more preferably up to 30/70, and also more preferably at least 10/90. The second recurring units used may be of a single type or a combination of recurring units of two or more types.

In addition to the first and second recurring units, other recurring units different from the first and second recurring units may be incorporated in the polymer (D) insofar as the contact angle with neutral water of a resist film comprising components (A) to (D) is larger than the contact angle of a resist film comprising components (A) to (C) and free of component (D). The other recurring units, if used, are preferably included in an amount of up to 20 mol % based on the entire recurring units of the polymer (D).

The polymer as component (D) should preferably have a weight average molecular weight (Mw) of 1,000 to 100,000, and more preferably 3,000 to 30,000, as measured by gel permeation chromatography (GPC) versus polystyrene standards. If Mw is less than 1,000, the resulting resist film may have a small contact angle with pure water. If Mw is in excess of 100,000, the polymer may have a low rate of dissolution in an alkaline developer and can give rise to the problem that when a photoresist film comprising that polymer is patterned, resin residues are deposited on the substrate.

The polymer added as component (D) to the resist film may be used alone or in admixture of two or more.

In preparing a resist composition for forming a resist film, the polymer (D) is preferably added in a (total) amount of 0.1 to 50 parts by weight, and more preferably 0.5 to 10 parts by weight per 100 parts by weight of the base resin (i.e., component (A) to be described later) in the resist composition. The resist film has a corresponding content of polymer (D). Addition of at least 0.1 pbw of the polymer (D) is effective for increasing the contact angle of a resist film with pure water and enhancing in-plane uniformity. More than 50 pbw of the polymer (D) may adversely affect the formation of a resist pattern and detract from the etch resistance of the resist pattern during dry etching of the processable substrate.

Component A

Component (A) in the resist film is a base resin which is insoluble in an aqueous alkaline solution, but turns to be soluble in an aqueous alkaline developer under the action of an acid. The base resin as component (A) is not particularly limited as long as it has a function of switching solubility in the aqueous alkaline developer and meets etch resistance during the subsequent dry etching step. Since high etch resistance is required when the photomask blank is processed, the base resin should preferably comprise recurring units having an aromatic structure.

As to the base resin comprising recurring units having an aromatic structure, a number of base resins were developed for use in positive resist compositions adapted for KrF excimer laser lithography. Basically, any of these base resins may be used herein. In the application to photomask blanks, there are also known a number of base resins including those described in U.S. Pat. No. 7,312,016 or JP-A 2005-326833, and any of these base resins may be used herein.

In general, these resins are alkali-soluble resins in which some or all of the phenolic hydroxyl groups and/or carboxyl groups are protected with acid labile protective groups having a C—O—C linkage so that the resins are normally insoluble in aqueous alkaline solution, but turn alkali soluble under the action of acid. The alkali-soluble resins having phenolic hydroxyl and/or carboxyl groups include homopolymers and copolymers of p-hydroxystyrene, m-hydroxystyrene, α-methyl-p-hydroxystyrene, 4-hydroxy-2-methylstyrene, 4-hydroxy-3-methylstyrene, hydroxyindene, methacrylic acid and acrylic acid, and such copolymers having a carboxylic derivative or diphenyl ethylene introduced at their terminus.

Also included are copolymers in which other units are introduced in addition to the above-described units in such a proportion that the solubility in an alkaline developer may not be extremely reduced. Suitable other units are units free of alkali-soluble sites such as units derived from styrene, α-methylstyrene, acrylate, methacrylate, hydrogenated hydroxystyrene, maleic anhydride, maleimide, and substituted or unsubstituted indene. Substituents on the acrylates and methacrylates may be any of the substituents which do not undergo acidolysis. Exemplary substituents are straight, branched or cyclic $C_1$-$C_8$ alkyl groups and aromatic groups such as aryl groups, but not limited thereto.

Examples of the alkali-soluble resins or polymers are given below. They may be used as the precursor for the resin (A) which changes its solubility in an alkaline developer solution under the action of an acid. Examples include poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene-α-methyl-p-hydroxystyrene copolymers, p-hydroxystyrene-α-methylstyrene copolymers, p-hydroxystyrene-styrene copolymers, p-hydroxystyrene-m-hydroxystyrene copolymers, p-hydroxystyrene-styrene copolymers, p-hydroxystyrene-indene copolymers, p-hydroxystyrene-acrylic acid copolymers, p-hydroxystyrene-methacrylic acid copolymers, p-hydroxystyrene-methyl acrylate copolymers, p-hydroxystyrene-acrylic acid-methyl methacrylate copolymers, p-hydroxystyrene-methyl methacrylate copolymers, p-hydroxystyrene-methacrylic acid-methyl methacrylate copolymers, poly(methacrylic acid), poly(acrylic acid), acrylic acid-methyl acrylate copolymers, methacrylic acid-methyl methacrylate copolymers, acrylic acid-maleimide copolymers, methacrylic acid-maleimide copolymers, p-hydroxystyrene-acrylic acid-maleimide copolymers, and p-hydroxystyrene-methacrylic acid-maleimide copolymers, but are not limited to these combinations.

Preferred are poly(p-hydroxystyrene), partially hydrogenated p-hydroxystyrene copolymers, p-hydroxystyrene-styrene copolymers, p-hydroxystyrene-indene copolymers, p-hydroxystyrene-acrylic acid copolymers, and p-hydroxystyrene-methacrylic acid copolymers.

Alkali-soluble resins comprising recurring units of the following formula (P1), (P2) or (P3) are especially preferred.

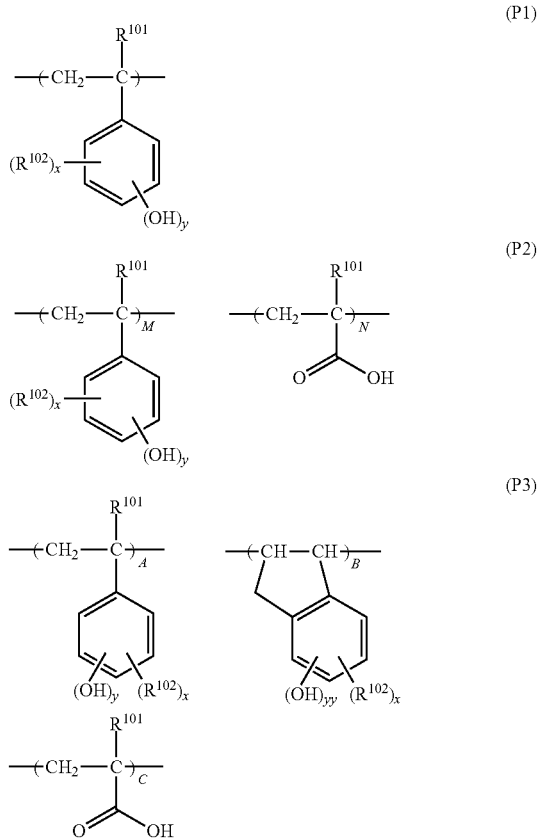

Herein $R^{101}$ is hydrogen or methyl, $R^{102}$ is a straight, branched or cyclic alkyl group of 1 to 8 carbon atoms, x is 0 or a positive integer, y is a positive integer, satisfying x+y≦5, M and N are positive integers, satisfying 0<N/(M+N)≦0.5, yy is 0 or a positive integer, satisfying x+yy≦4, and A and B are positive integers, and C is 0 or a positive integer, satisfying 0<B/(A+B+C)≦0.5.

The polymer of formula (P3) can be synthesized, for example, by effecting thermal polymerization of an acetoxystyrene monomer, a tertiary alkyl (meth)acrylate monomer and an indene monomer in an organic solvent in the presence of a radical initiator, and subjecting the resulting polymer to alkaline hydrolysis in an organic solvent for deprotecting the acetoxy group, for thereby forming a ternary copolymer of hydroxystyrene, tertiary alkyl (meth)acrylate and indene. The organic solvent used during polymerization is exemplified by toluene, benzene, tetrahydrofuran, diethyl ether and dioxane. Exemplary polymerization initiators include 2,2'-azobisisobutyronitrile, 2,2'-azobis(2,4-dimethylvaleronitrile), dimethyl-2,2-azobis(2-methylpropionate), benzoyl peroxide, and lauroyl peroxide. Polymerization is preferably effected while heating at 50 to 80° C. The reaction time is usually about 2 to 100 hours, preferably about 5 to 20 hours. Aqueous ammonia, triethylamine or the like may be used as the base for the alkaline hydrolysis. For the alkaline hydrolysis, the temperature is usually −20° C. to 100° C., preferably 0° C. to 60° C., and the time is about 0.2 to 100 hours, preferably about 0.5 to 20 hours.

Also included are polymers having the dendritic or hyperbranched polymer structure of formula (P4) below.

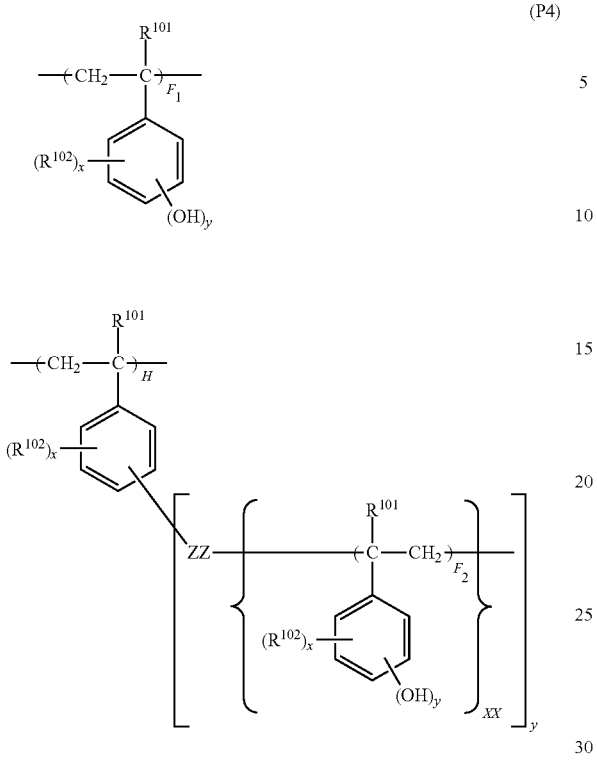

(P4)

Herein XX is 1 or 2. ZZ is a divalent organic group selected from among —CH$_2$—, —CH(OH)—, and —CR$^{102}$(OH)— when XX=1, or a trivalent organic group of the formula:

when XX=2. Subscripts F$_1$ and F$_2$ are positive integers, and H is a positive integer, satisfying $0.001 \leq H/(H+F_1+F_2) \leq 0.1$. R$^{101}$, R$^{102}$, x and y are as defined for formulas (P1) to (P3).

The dendritic or hyperbranched polymer of phenol derivative can be synthesized by effecting living anion polymerization of a polymerizable monomer such as 4-tert-butoxystyrene and reacting a branching monomer such as chloromethylstyrene as appropriate during the living anion polymerization.

More particularly, living anion polymerization is started using a polymerizable monomer such as 4-tert-butoxystyrene. After a predetermined amount has been polymerized, a branching monomer such as chloromethylstyrene is introduced and reacted with the intermediate. Then the polymerizable monomer such as 4-tert-butoxystyrene and/or the branching monomer such as chloromethylstyrene is added again for polymerization. This operation is repeated many times until a desired dendritic or hyperbranched polymer is obtained. If necessary, the protective groups used to enable living polymerization are deprotected, yielding a dendritic or hyperbranched polymer of phenol derivative.

Examples of the branching monomer are given below.

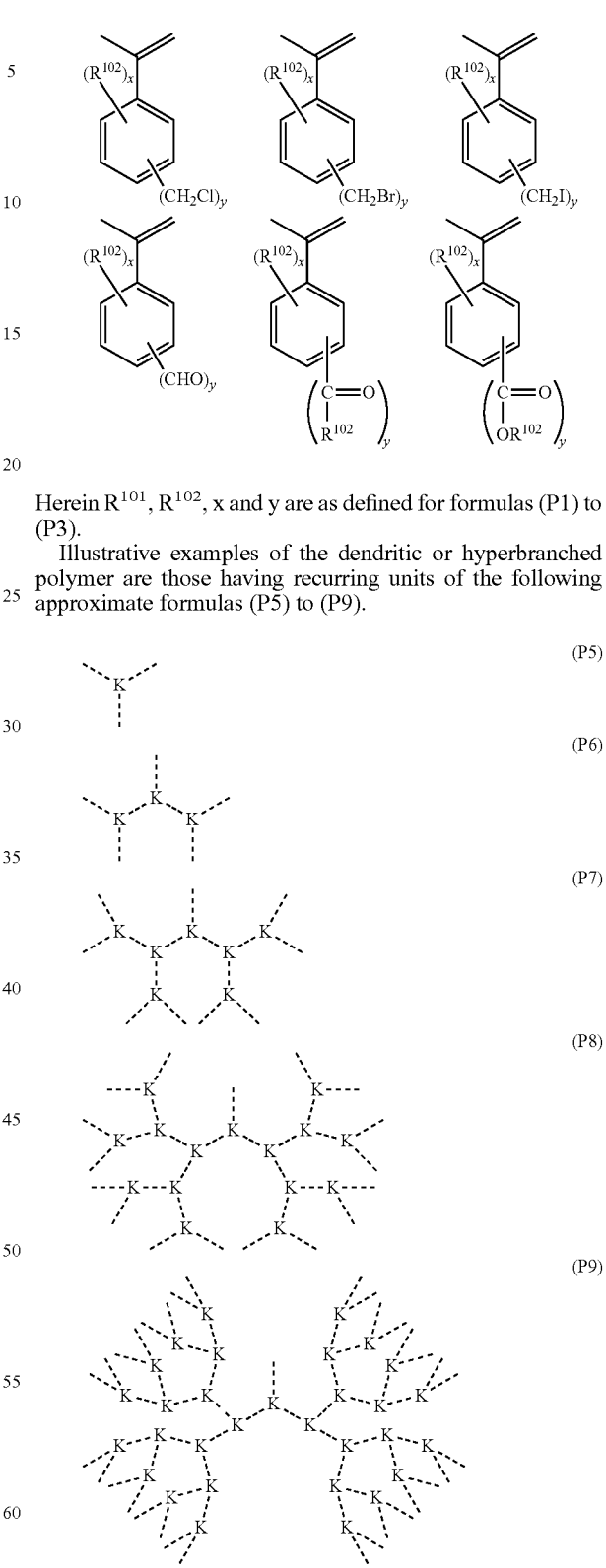

Herein R$^{101}$, R$^{102}$, x and y are as defined for formulas (P1) to (P3).

Illustrative examples of the dendritic or hyperbranched polymer are those having recurring units of the following approximate formulas (P5) to (P9).

Herein, broken lines ( - - - ) represent polymer chains derived from the phenol derivative monomer, and K represents units derived from the branching monomer. The number of broken line segments between K and K is depicted merely for the sake of convenience, independent of the number of recurring units in the polymer chain included between K and K.

The dendritic or hyperbranched polymer of a phenol derivative is prepared by effecting living polymerization of the phenol derivative, reacting with a compound having a polymerizable moiety and a terminating moiety and proceeding further polymerization. By repeating this operation desired times, a dendritic or hyperbranched polymer of phenol derivative can be synthesized. The living polymerization may be effected by any desired technique although living anion polymerization is preferred because of ease of control. For the detail of synthesis, reference is made to JP-A 2000-344836.

The dendritic or hyperbranched polymer of a phenol derivative should preferably have a weight average molecular weight (Mw) of 3,000 to 100,000, as measured by gel permeation chromatography (GPC) versus polystyrene standards. Many polymers with Mw of less than 3,000 do not perform well and are poor in heat resistance and film formation. Many polymers with Mw of more than 100,000 give rise to a problem with respect to dissolution in the resist solvent and developer. The polymer should also preferably have a dispersity (Mw/Mn) of up to 3.5, and more preferably up to 1.5. With a dispersity of more than 3.5, resolution is low in many cases. Although the preparation method is not critical, a poly(p-hydroxystyrene) or similar polymer with a low dispersity or narrow dispersion can be synthesized by living anion polymerization.

Component (A) used in the resist film of the invention is preferably an otherwise alkali-soluble resin as mentioned above which is made insoluble in an aqueous alkaline developer by incorporating protective groups having C—O—C linkages (or acid labile groups) which can be scissored under the action of an acid. Especially preferred is a polymer comprising recurring units of the above formula (P1) and containing phenolic hydroxyl groups in which hydrogen atoms of the phenolic hydroxyl groups are substituted by acid labile groups of one or more types in a proportion of more than 0 mol % to 80 mol % on the average of the entire hydrogen atoms of the phenolic hydroxyl group, the polymer having a weight average molecular weight of 3,000 to 100,000.

Also preferred is a polymer comprising recurring units of the above formula (P2), that is, a copolymer comprising p-hydroxystyrene and/or α-methyl-p-hydroxystyrene and acrylic acid and/or methacrylic acid, wherein some of the hydrogen atoms of the carboxyl groups of acrylic acid and/or methacrylic acid are substituted by acid labile groups of one or more types, and the units derived from acrylate and/or methacrylate are contained in a proportion of more than 0 mol % to 50 mol %, on the average, of the copolymer, and wherein some of the hydrogen atoms of the phenolic hydroxyl groups of p-hydroxystyrene and/or α-methyl-p-hydroxystyrene may be substituted by acid labile groups of one or more types. In the preferred copolymer, the units derived from acrylate and/or methacrylate and from p-hydroxystyrene and/or α-methyl-p-hydroxystyrene having acid labile groups substituted thereon are contained in a proportion of more than 0 mol % to 80 mol %, on the average, of the copolymer.

Alternatively, a polymer comprising recurring units of the above formula (P3), that is, a copolymer comprising p-hydroxystyrene and/or α-methyl-p-hydroxystyrene and substituted and/or unsubstituted indene, is preferred wherein some of the hydrogen atoms of the phenolic hydroxyl groups on p-hydroxystyrene and/or α-methyl-p-hydroxystyrene are substituted by acid labile groups of one or more types, and/or some of the hydrogen atoms of the carboxyl groups on acrylic acid and/or methacrylic acid are substituted by acid labile groups of one or more types. Where the substituted indene has hydroxyl groups, some of the hydrogen atoms of these hydroxyl groups may be substituted by acid labile groups of one or more types. In the preferred copolymer, the units derived from p-hydroxystyrene and/or α-methyl-p-hydroxystyrene having acid labile groups substituted thereon, the units derived from acrylic acid and/or methacrylic acid having acid labile groups substituted thereon, and the units derived from indene having acid labile groups substituted thereon are contained in a proportion of more than 0 mol % to 80 mol %, on the average, of the copolymer.

Exemplary and preferred such polymers are polymers or high molecular weight compounds comprising recurring units represented by the following general formula (P1a), (P2a) or (P3a) and having a weight average molecular weight of 3,000 to 100,000.

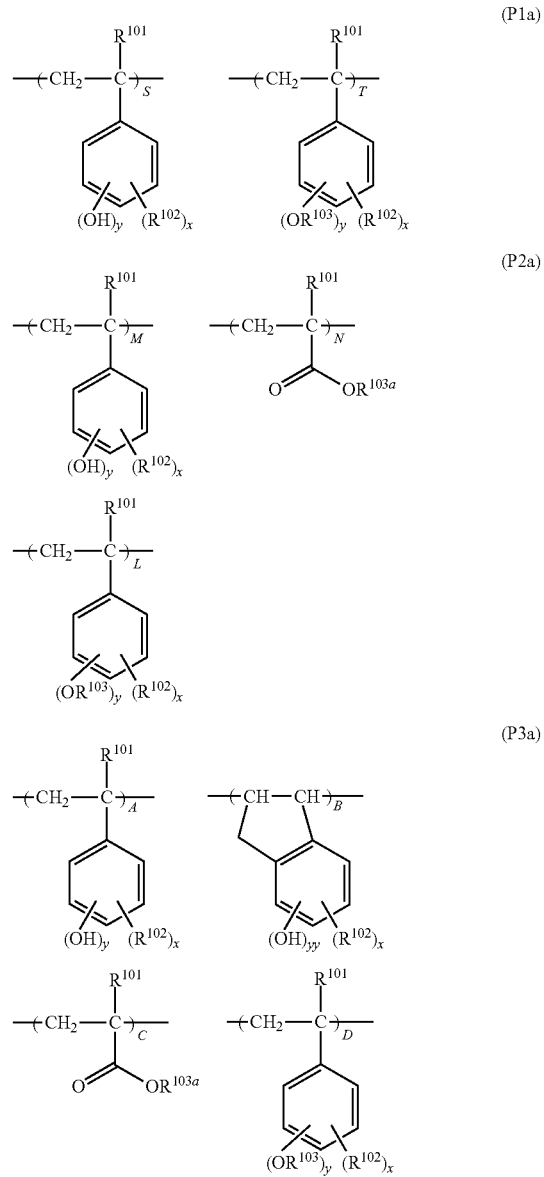

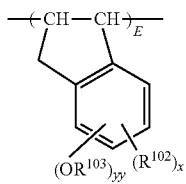

Herein, $R^{101}$ is hydrogen or methyl. $R^{102}$ is a straight, branched or cyclic alkyl group of 1 to 8 carbon atoms. Letter x is 0 or a positive integer, and y is a positive integer, satisfying $x+y \leq 5$. $R^{103}$ is an acid labile group. S and T are positive integers, satisfying $0<T/(S+T) \leq 0.8$. All or at least some of $R^{103a}$ are acid labile groups. M and N are positive integers, L is 0 or a positive integer, satisfying $0<N/(M+N+L) \leq 0.5$ and $0<(N+L)/(M+N+L) \leq 0.8$. The letter yy is 0 or a positive integer, satisfying $x+yy \leq 4$. A and B are positive integers, C, D and E each are 0 or a positive integer, satisfying $0<(B+E)/(A+B+C+D+E) \leq 0.5$ and $0<(C+D+E)/(A+B+C+D+E) \leq 0.8$.

$R^{102}$ stands for straight, branched or cyclic $C_1$-$C_8$ alkyl groups, for example, methyl, ethyl, propyl, isopropyl, n-butyl, isobutyl, tert-butyl, cyclohexyl and cyclopentyl.

In the event some of phenolic hydroxyl groups or some or all of carboxyl groups on the alkali-soluble resin are protected with acid labile substituent groups represented by C—O—C linkage, the acid labile groups are selected from a variety of such groups. The preferred acid labile groups are groups of the following general formulae (P10) to (P13), tertiary alkyl groups of 4 to 20 carbon atoms, preferably 4 to 15 carbon atoms, trialkylsilyl groups whose alkyl groups each have 1 to 6 carbon atoms, oxoalkyl groups of 4 to 20 carbon atoms, or aryl-substituted alkyl groups of 7 to 20 carbon atoms. Inter alia, tertiary alkyl groups of 4 to 20 carbon atoms and groups of the following general formula (P12) are more preferred.

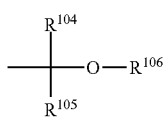
(P10)

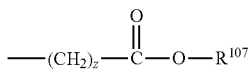
(P11)

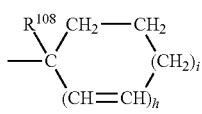
(P12)

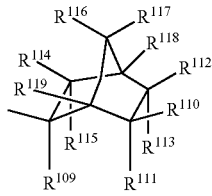
(P13)

Herein $R^{104}$ and $R^{105}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{106}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are substituted by hydroxyl, alkoxy, oxo, amino or alkylamino groups. Illustrative examples of the substituted alkyl groups are given below.

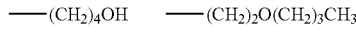
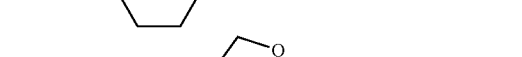
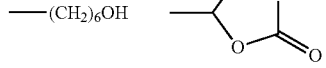

A pair of $R^{104}$ and $R^{105}$, a pair of $R^{104}$ and $R^{106}$, or a pair of $R^{105}$ and $R^{106}$ taken together, may form a ring. Each of $R^{104}$, $R^{105}$ and $R^{106}$ is a straight or branched alkylene group of 1 to 18 carbon atoms, preferably 1 to 10 carbon atoms, when they form a ring.

$R^{107}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (P10). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl and 1-adamantyl-1-methylethyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxolan-4-yl. Letter z is an integer of 0 to 6.

$R^{108}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl and cyclohexylethyl. Exemplary substituted or unsubstituted aryl groups include phenyl, methylphenyl, naphthyl, anthryl, phenanthryl, and pyrenyl. Letter h is equal to 0 or 1, i is equal to 0, 1, 2 or 3, satisfying $2h+i=2$ or 3.

$R^{109}$ is a straight, branched or cyclic alkyl group of 1 to 8 carbon atoms or substituted or unsubstituted aryl group of 6 to 20 carbon atoms, examples of which are as exemplified for $R^{108}$. $R^{110}$ to $R^{119}$ are independently hydrogen or monovalent hydrocarbon groups of 1 to 15 carbon atoms which may contain a hetero atom, for example, straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, and cyclohexylbutyl, and substituted ones of these groups in which some hydrogen atoms are substituted by hydroxyl, alkoxy, carboxy, alkoxycarbonyl, oxo, amino, alkylamino, cyano, mercapto, alkylthio, and sulfo groups. Any two of $R^{110}$ to $R^{119}$ for example, a pair of $R^{110}$ and $R^{111}$, a pair of $R^{110}$ and $R^{112}$, a pair of $R^{111}$ and $R^{113}$, a pair of $R^{112}$ and $R^{113}$, a pair of $R^{114}$ and $R^{115}$, or a pair of $R^{116}$ and $R^{117}$, taken together, may form a ring. When any two of $R^{110}$ to $R^{119}$ form a ring, each is a divalent hydrocarbon group of 1 to 15 carbon atoms which may contain a hetero atom, examples of which are the above-exemplified monovalent hydrocarbon groups with one hydrogen atom eliminated.

Also, two of $R^{110}$ to $R^{119}$ which are attached to vicinal carbon atoms (for example, a pair of $R^{110}$ and $R^{112}$, a pair of $R^{112}$ and $R^{118}$ or a pair of $R^{116}$ and $R^{118}$) may directly bond together to form a double bond.

Of the acid labile groups of formula (P10), illustrative examples of the straight or branched groups are given below.

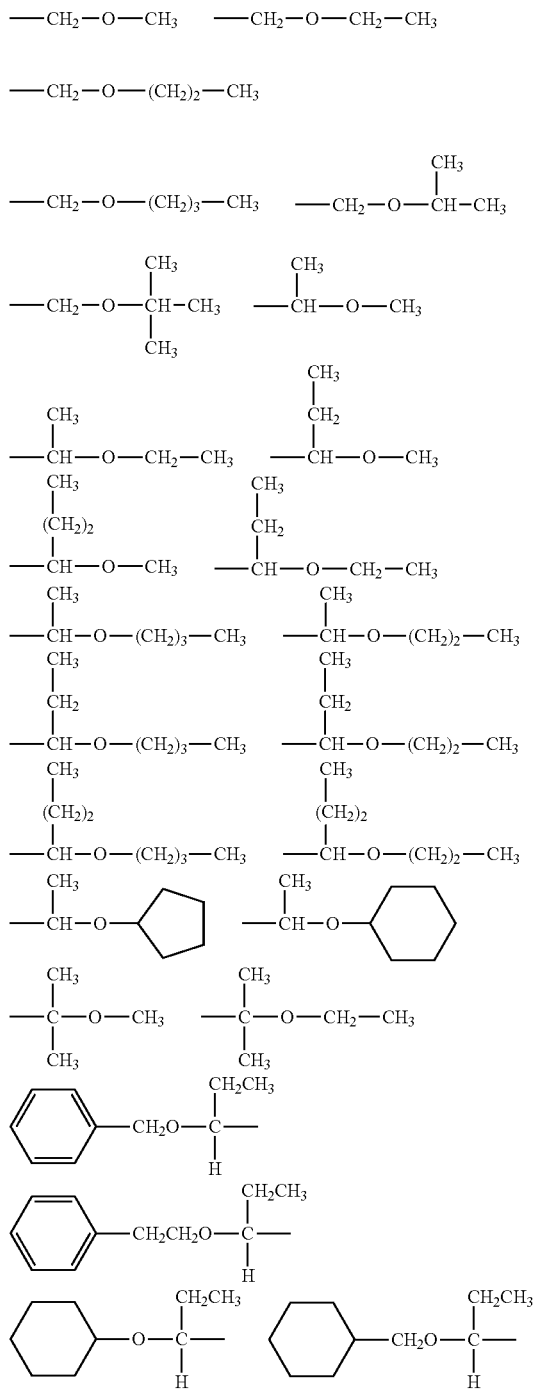

Of the acid labile groups of formula (P10), illustrative examples of the cyclic groups include tetrahydrofuran-2-yl, 2-methyltetrahydrofuran-2-yl, tetrahydropyran-2-yl and 2-methyltetrahydropyran-2-yl.

Illustrative examples of the acid labile groups of formula (P11) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Illustrative examples of the acid labile groups of formula (P12) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, 3-ethyl-1-cyclohexen-3-yl, and 1-cyclohexyl-cyclopentyl.

Illustrative examples of the acid labile groups of formula (P13) are given below.

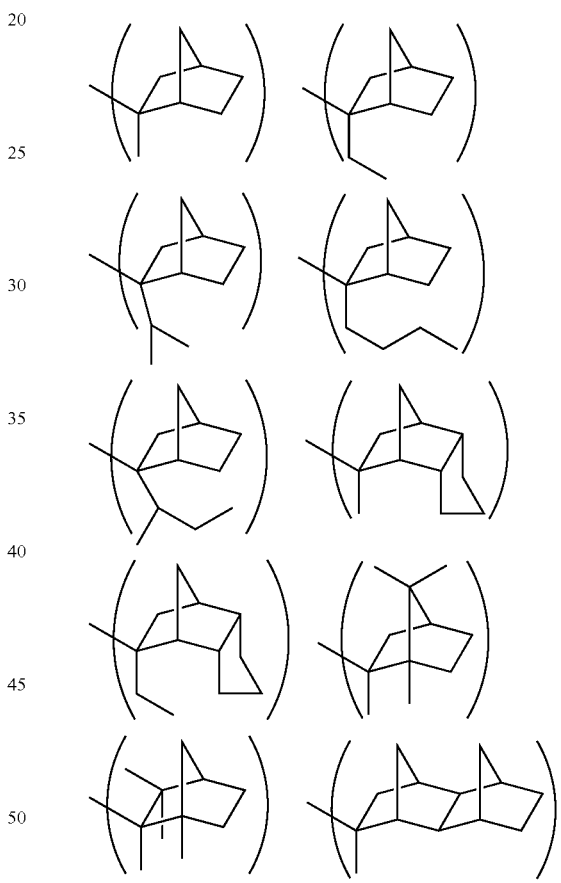

Exemplary of the tertiary alkyl group of 4 to 20 carbon atoms, preferably 4 to 15 carbon atoms, are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 1-adamantyl-1-methyl-ethyl.

Exemplary of the trialkylsilyl groups whose alkyl groups each have 1 to 6 carbon atoms are trimethylsilyl, triethylsilyl, and tert-butyldimethylsilyl.

Exemplary of the oxoalkyl groups of 4 to 20 carbon atoms are 3-oxocyclohexyl and groups represented by the following formulae.

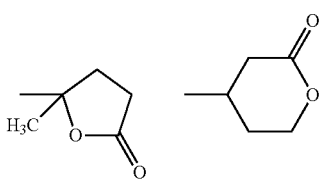

Exemplary of the aryl-substituted alkyl groups of 7 to 20 carbon atoms are benzyl, methylbenzyl, dimethylbenzyl, diphenylmethyl, and 1,1-diphenylethyl.

In the resist film, component (A) may also be a polymer of formula (P1), (P2), (P3) or (P4) in which some of the hydrogen atoms of the phenolic hydroxyl groups are crosslinked within a molecule and/or between molecules, in a proportion of more than 0 mol % to 50 mol %, on the average, of the entire phenolic hydroxyl groups on the polymer, with crosslinking groups having C—O—C linkages represented by the following general formula (P14). With respect to illustrative examples and synthesis of polymers crosslinked with acid labile groups, reference should be made to JP-A 11-190904.

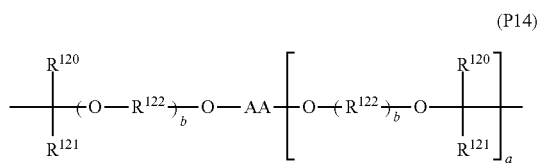

(P14)

Herein, each of $R^{112}$ and $R^{121}$ is hydrogen or a straight, branched or cyclic alkyl group of 1 to 8 carbon atoms, or $R^{120}$ and $R^{121}$, taken together, may form a ring, and each of $R^{120}$ and $R^{121}$ is a straight or branched alkylene group of 1 to 8 carbon atoms when they form a ring. $R^{122}$ is a straight, branched or cyclic alkylene group of 1 to 10 carbon atoms. Letter "b" is 0 or an integer of 1 to 10. AA is an a-valent aliphatic or alicyclic saturated hydrocarbon group, aromatic hydrocarbon group or heterocyclic group of 1 to 50 carbon atoms, which may be separated by a hetero atom and in which some of the hydrogen atom attached to carbon atoms may be substituted by hydroxyl, carboxyl, carbonyl or halogen. Letter "a" is an integer of 1 to 7, especially 1 to 3.

Preferably in formula (P14), $R^{120}$ is methyl, $R^{121}$ is hydrogen, $R^{122}$ is methylmethine or ethylmethine, a is 1, b is 0, and AA is ethylene, 1,4-butylene or 1,4-cyclohexylene.

It is noted that these polymers which are crosslinked within the molecule or between molecules with crosslinking groups having C—O—C linkages can be synthesized by reacting a corresponding non-crosslinked polymer with an alkenyl ether in the presence of an acid catalyst in a conventional manner.

If decomposition of other acid labile groups proceeds under acid catalyst conditions, the end product can be obtained by once reacting the alkenyl ether with hydrochloric acid or the like for conversion to a halogenated alkyl ether and reacting it with the polymer under basic conditions in a conventional manner.

Illustrative, non-limiting, examples of the alkenyl ether include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, neopentyl glycol divinyl ether, trimethylolpropane trivinyl ether, trimethylolethane trivinyl ether, hexanediol divinyl ether, and 1,4-cyclohexanediol divinyl ether.

In the resist film, the resin used as component (A) is as described above while the preferred acid labile groups to be substituted for phenolic hydroxyl groups are 1-ethoxyethyl, 1-ethoxypropyl, tetrahydrofuranyl, tetrahydropyranyl, tert-butyl, tert-amyl, 1-ethylcyclohexyloxycarbonylmethyl, tert-butoxycarbonyl, tert-butoxycarbonylmethyl, and substituents of formula (P14) wherein $R^{120}$ is methyl, $R^{121}$ is hydrogen, $R^{122}$ is methylmethine or ethylmethine, a is 1, b is 0, and AA is ethylene, 1,4-butylene or 1,4-cyclohexylene. Also preferably, the hydrogen atoms of carboxyl groups on methacrylic acid or acrylic acid are protected with substituent groups as typified by tert-butyl, tert-amyl, 2-methyl-2-adamantyl, 2-ethyl-2-adamantyl, 1-ethylcyclopentyl, 1-ethylcyclohexyl, 1-cyclohexylcyclopentyl, 1-ethylnorbornyl, tetrahydrofuranyl and tetrahydropyranyl.

In a single polymer, these substituents may be incorporated alone or in admixture of two or more types. A blend of two or more polymers having substituents of different types is also acceptable.

The percent proportion of these substituents substituting for phenol and carboxyl groups in the polymer is not critical. Preferably the percent substitution is selected such that when a resist composition comprising the polymer is applied onto a substrate to form a coating, the unexposed area of the coating may have a dissolution rate of 0.01 to 10 Å/sec in a 2.38% tetramethylammonium hydroxide (TMAH) developer.

On use of a polymer containing a greater proportion of carboxyl groups which can reduce the alkali dissolution rate, the percent substitution must be increased or non-acid-decomposable substituents to be described later must be introduced.

When acid labile groups for intramolecular and/or intermolecular crosslinking are to be introduced, the percent proportion of crosslinking substituents is preferably up to 20 mol %, more preferably up to 10 mol %, on the average, based on the entire recurring units of the polymer. If the percent substitution of crosslinking substituents is too high, crosslinking results in a higher molecular weight which can adversely affect dissolution, stability and resolution. It is also preferred to further introduce another non-crosslinking acid labile group into the crosslinked polymer at a percent substitution of up to 10 mol %, on the average, for adjusting the dissolution rate to fall within the above range.

In the case of poly(p-hydroxystyrene), the optimum percent substitution differs between a substituent having a strong dissolution inhibitory action such as a tert-butoxycarbonyl group and a substituent having a weak dissolution inhibitory action such as an acetal group although the overall percent substitution is preferably 10 to 40 mol %, more preferably 20 to 30 mol %, on the average, based on the entire recurring units of the polymer.

Polymers having such acid labile groups introduced therein should preferably have a weight average molecular weight (Mw) of 3,000 to 100,000, as measured by GPC versus polystyrene standards. With a Mw of less than 3,000, polymers would perform poorly and often lack heat resistance and film formability. Polymers with a Mw of more than 100,000 would be less soluble in a developer and a resist solvent.

Where non-crosslinking acid labile groups are introduced, the polymer should preferably have a dispersity (Mw/Mn) of up to 3.5, preferably up to 1.5. A polymer with a dispersity of more than 3.5 often results in a low resolution. Where crosslinking acid labile groups are introduced, the starting alkali-soluble resin should preferably have a dispersity (Mw/Mn) of up to 1.5, and the dispersity is kept at 3 or lower even after protection with crosslinking acid labile groups. If the dispersity is higher than 3, dissolution, coating, storage stability and/or resolution is often poor.

To impart a certain function, suitable substituent groups may be introduced into some of the phenolic hydroxyl and carboxyl groups on the acid labile group-protected polymer. Exemplary are substituent groups for improving adhesion to the substrate, non-acid-labile groups for adjusting dissolution in an alkali developer, and substituent groups for improving etching resistance. Illustrative, non-limiting, substituent groups include 2-hydroxyethyl, 2-hydroxypropyl, methoxymethyl, methoxycarbonyl, ethoxycarbonyl, methoxycarbonylmethyl, ethoxycarbonylmethyl, 4-methyl-2-oxo-4-oxolanyl, 4-methyl-2-oxo-4-oxanyl, methyl, ethyl, propyl, n-butyl, sec-butyl, acetyl, pivaloyl, adamantyl, isoboronyl, and cyclohexyl.

Notably, the use of acid labile groups other than those of the acetal type is preferred for reducing the top loss at the resist top concomitant with a thickness reduction. Specifically, tertiary ethers and tertiary esters are preferred. For phenolic hydroxyl groups, such substituent groups as tert-butyl, tert-amyl, and 1-ethylcyclohexyloxycarbonylmethyl are preferably used. For hydrogen atoms of the carboxyl group on methacrylic acid or acrylic acid, such substituent groups as tert-butyl, tert-amyl, 2-methyl-2-adamantyl, 2-ethyl-2-adamantyl, 1-ethylcyclopentyl, 1-ethylcyclohexyl, 1-cyclohexylcyclopentyl, and 1-ethylnorbornyl are desirable. Protection with these substituent groups is desired.

A resist film is formed on a workpiece such as a photomask blank by diluting the resist composition into a solution form and applying the solution to the workpiece. In the resist composition solution, the above-described resin is preferably added in an amount of 65 to 99 parts by weight, and more preferably 65 to 98 parts by weight among 100 parts by weight of the solids in the resist composition solution. The term "solids" is used to encompass all components in the resist composition excluding the solvent.

The polymers serving as the base resin or component (A) may be used alone or in admixture. Use of a mixture of such polymers allows for adjustment of the performance of resist material.

Component B

Component (B) included in the resist composition is an acid generator which is decomposed with high-energy radiation whereby the neutral substance (or generator) is converted into an acidic substance so that the resist composition functions as a chemically amplified positive resin composition. It is generally known as "photoacid generator." In this context, those compounds which generate acid in response to high-energy radiation, not limited to light, are referred to as "photoacid generators" in a sense to be distinguished from thermal acid generators used with thermosetting resins. Any photoacid generators may be used herein insofar as they generate acid upon exposure to high-energy radiation. Suitable photoacid generators include sulfonium salts, iodonium salts, sulfonyldiazomethane, N-sulfonyloxydicarboxylmide, O-arylsulfonyloxime, and O-alkylsulfonyloxime photoacid generators. Exemplary photoacid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyldiphenylsulfonium, 4-tert-butylphenyldiphenylsulfonium, bis(4-methylphenyl)phenylsulfonium, bis(4-tert-butylphenyl)phenylsulfonium, tris(4-methylphenyl)sulfonium, tris(4-tert-butylphenyl)sulfonium, tris(phenylmethyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxopropylthiacyclopentanium, 2-oxobutylthiacyclopentanium, 2-oxo-3,3-dimethylbutylthiacyclopentanium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, heptafluoropropanesulfonate, nonafluorobutanesulfonate, tridecafluorohexanesulfonate, perfluoro (4-ethylcyclohexane)sulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl) difluoromethanesulfonate, and 4-oxo-1-adamantyloxycarbonyldifluoromethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris (substituted alkylsulfonyl)methide is tris(trifluoromethylsulfonyl)methide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl) difluoromethanesulfonate, and 4-oxo-1-adamantyloxycarbonyldifluoromethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(4-acetyloxyphenylsulfonyl)diazomethane, bis(4-methanesulfonylphenylsulfonyl)diazomethane, bis(4-(p-toluenesulfonyloxy)phenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxyphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalenedicarboximide, phthalimide, cyclohexyldicarboximide, 5-norbornene-2,3-dicarboximide, and 7-oxabicyclo[2.2.1]-5-heptene-2,3-dicarboximide. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl) difluoromethanesulfonate, and 4-oxo-1-adamantyloxycarbonyldifluoromethanesulfonate.

Suitable O-arylsulfonyloxime compounds and O-alkylsulfonyloxime compounds (oxime sulfonates) include photoacid generators in the form of glyoxime derivatives, oxime sulfonates with a long conjugated system separated by thiophene or cyclohexadiene, oxime sulfonates having an electron withdrawing group such as trifluoromethyl incorporated for increased stability, oxime sulfonates using phenylacetonitrile or substituted acetonitrile derivatives, and bisoxime sulfonates.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(4-fluorobenzenesulfonyl)-nioxime, bis-O-(4-trifluoromethylbenzenesulfonyl)-nioxime, and bis-O-(xylenesulfonyl)-nioxime. Also included are compounds of the foregoing skeleton having substituted thereon 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Photoacid generators in the form of oxime sulfonates with a long conjugated system separated by thiophene or cyclohexadiene include (5-(p-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyl)oxyimino-5H-thiophen-2-ylidene)phenylacetonitrile, (5-(p-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyl)oxyimino-5H-thiophen-2-ylidene)(2-methylphenyl)acetonitrile, (5-(4-(p-toluenesulfonyloxy)benzenesulfonyl)oxyimino-5H-thiophen-2-ylidene)phenylacetonitrile, and (5-(2,5-bis(p-toluenesulfonyloxy)benzenesulfonyl)oxyimino-5H-thiophen-2-ylidene)phenylacetonitrile. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Suitable oxime sulfonates having an electron withdrawing group such as trifluoromethyl incorporated for increased stability include 2,2,2-trifluoro-1-phenyl-ethanone O-(methylsulfonyl)oxime, 2,2,2-trifluoro-1-phenyl-ethanone O-(10-camphorsulfonyl)oxime, 2,2,2-trifluoro-1-phenylethanone O-(4-methoxybenzenesulfonyl)-oxime, 2,2,2-trifluoro-1-phenylethanone O-(1-naphthylsulfonyl)oxime, 2,2,2-trifluoro-1-phenylethanone O-(2-naphthylsulfonyl)oxime, 2,2,2-trifluoro-1-phenylethanone O-(2,4,6-trimethylphenylsulfonyl)oxime, 2,2,2-trifluoro-1-(4-methylphenyl)ethanone O-(10-camphor-sulfonyl)oxime, 2,2,2-trifluoro-1-(4-methylphenyl)ethanone O-(methylsulfonyl)-oxime, 2,2,2-trifluoro-1-(2-methylphenyl)ethanone O-(10-camphor-sulfonyl)oxime, 2,2,2-trifluoro-1-(2,4-dimethylphenyl)ethanone O-(10-camphor-sulfonyl)oxime, 2,2,2-trifluoro-1-(2,4-dimethylphenyl)ethanone O-(1-naphthyl-sulfonyl)oxime, 2,2,2-trifluoro-1-(2,4-dimethylphenyl)-ethanone O-(2-naphthyl-sulfonyl)oxime, 2,2,2-trifluoro-1-(2,4,6-trimethylphenyl)ethanone O-(10-camphorsulfonyl)oxime, 2,2,2-trifluoro-1-(2,4,6-trimethylphenyl)ethanone O-(1-naphthylsulfonyl)oxime, 2,2,2-trifluoro-1-(2,4,6-trimethylphenyl)ethanone O-(2-naphthylsulfonyl)oxime, 2,2,2-trifluoro-1-(4-methoxyphenyl)ethanone O-(methyl-sulfonyl)oxime, 2,2,2-trifluoro-1-(4-methylthiophenyl)-ethanone O-(methyl-sulfonyl)oxime, 2,2,2-trifluoro-1-(3,4-dimethoxyphenyl)ethanone O-(methyl-sulfonyl) oxime, 2,2,2-trifluoro-1-(4-methoxyphenyl)ethanone O-(4-methylphenylsulfonyl)oxime, 2,2,2-trifluoro-1-(4-methoxyphenyl)ethanone O-(4-methoxy-phenylsulfonyl)oxime, 2,2,2-trifluoro-1-(4-methoxyphenyl)ethanone O-(4-dodecyl-phenylsulfonyl)oxime, 2,2,2-trifluoro-1-(4-methoxyphenyl)ethanone O-(octylsulfonyl)-oxime, 2,2,2-trifluoro-1-(4-thiomethylphenyl)ethanone O-(4-methoxy-phenylsulfonyl)oxime, 2,2,2-trifluoro-1-(4-thiomethylphenyl)ethanone O-(4-dodecyl-phenylsulfonyl)oxime, 2,2,2-trifluoro-1-(4-thiomethylphenyl)ethanone O-(octyl-sulfonyl)oxime, 2,2,2-trifluoro-1-(4-thiomethylphenyl)ethanone O-(2-naphthyl-sulfonyl)oxime, 2,2,2-trifluoro-1-(2-methylphenyl)ethanone O-(methylsulfonyl)-oxime, 2,2,2-trifluoro-1-(4-methylphenyl)ethanone O-(phenylsulfonyl)-oxime, 2,2,2-trifluoro-1-(4-chlorophenyl)ethanone O-(phenylsulfonyl)-oxime, 2,2,3,3,4,4,4-heptafluoro-1-phenylbutanone O-(10-camphor-sulfonyl)oxime, 2,2,2-trifluoro-1-(1-naphthyl)ethanone O-(methylsulfonyl) oxime, 2,2,2-trifluoro-1-(2-naphthyl)ethanone O-(methylsulfonyl)oxime, 2,2,2-trifluoro-1-(4-benzylphenyl)ethanone O-(methylsulfonyl)-oxime, 2,2,2-trifluoro-1-(4-(phenyl-1,4-dioxa-but-1-yl)phenyl)-ethanone O-(methylsulfonyl)oxime, 2,2,2-trifluoro-1-(1-naphthyl)ethanone O-(propylsulfonyl) oxime, 2,2,2-trifluoro-1-(2-naphthyl)ethanone O-(propylsulfonyl)oxime, 2,2,2-trifluoro-1-(4-benzylphenyl)ethanone O-(propylsulfonyl)-oxime, 2,2,2-trifluoro-1-(4-methylsulfonylphenyl)ethanone O-(propyl-sulfonyl)oxime, 2,2,2-trifluoro-1-(4-methylsulfonyloxyphenyl)ethanone O-(propyl-sulfonyl)oxime, 2,2,2-trifluoro-1-(4-methylcarbonyloxyphenyl)ethanone O-(propylsulfonyl) oxime, 2,2,2-trifluoro-1-(6H, 7H-5,8-dioxonaphth-2-yl)

ethanone O-(propylsulfonyl)oxime, 2,2,2-trifluoro-1-(4-methoxycarbonylmethoxyphenyl)ethanone O-(propylsulfonyl)oxime, 2,2,2-trifluoro-1-(4-methoxycarbonyl)-(4-amino-1-oxa-pent-1-yl)phenyl)ethanone 0-(propylsulfonyl)oxime, 2,2,2-trifluoro-1-(3,5-dimethyl-4-ethoxyphenyl)ethanone O-(propylsulfonyl)oxime, 2,2,2-trifluoro-1-(4-benzyloxyphenyl)ethanone 0-(propyl-sulfonyl)oxime, 2,2,2-trifluoro-1-(2-thiophenyl)ethanone O-(propylsulfonate)-oxime, and 2,2,2-trifluoro-1-(1-dioxathiophen-2-yl) ethanone O-(propylsulfonate) oxime; 2,2,2-trifluoro-1-(4-(3-(4-(2,2,2-trifluoro-1-(trifluoro-methanesulfonyloxyimino) ethyl)phenoxy)propoxy)phenyl)ethanone O-(trifluoromethanesulfonyl)oxime, 2,2,2-trifluoro-1-(4-(3-(4-(2,2,2-trifluoro-1-(1-propane-sulfonyloxyimino)ethyl) phenoxy)propoxy)phenyl)ethanone O-(propylsulfonyl) oxime, 2,2,2-trifluoro-1-(4-(3-(4-(2,2,2-trifluoro-1-(1-butane-sulfonyloxyimino)ethyl)phenoxy)propoxy)phenyl) ethanone O-(butylsulfonyl)oxime, 2,2,2-trifluoro-1-(4-(3-(4-(2,2,2-trifluoro-1-(4-(4-methylphenylsulfonyloxy) phenylsulfonyloxyimino)ethyl)phenoxy)-propoxy)phenyl) ethanone O-(4-(4-methylphenylsulfonyloxy)-phenylsulfonyl)oxime, and 2,2,2-trifluoro-1-(4-(3-(4-(2,2,2-trifluoro-1-(2,5-bis(4-methylphenylsulfonyloxy) benzenesulfonyloxy)phenylsulfonyloxy-imino)ethyl) phenoxy)propoxy)phenyl)ethanone O-(2,5-bis(4-methylphenylsulfonyloxy)benzenesulfonyloxy) phenylsulfonyl)-oxime. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl) difluoromethanesulfonate, and 4-oxo-1-adamantyloxycarbonyldifluoromethanesulfonate.

Also included are oxime sulfonates having the formula (Ox-1):

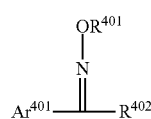

(Ox-1)

wherein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is substituted or unsubstituted aromatic or hetero-aromatic group.

Examples include 2-[2,2,3,3,4,4,5,5-octafluoro-1-(nonafluorobutylsulfonyloxy-imino)pentyl]fluorene, 2-[2,2,3,3, 4,4-pentafluoro-1-(nonafluorobutylsulfonyloxy-imino)butyl]fluorene, 2-[2,2,3,3,4,4,5,5,6,6-decafluoro-1-(nonafluorobutylsulfonyl-oxyimino)hexyl]fluorene, 2-[2,2, 3,3,4,4,5,5-octafluoro-1-(nonafluorobutylsulfonyloxy-imino)pentyl]-4-biphenyl, 2-[2,2,3,3,4,4-pentafluoro-1-(nonafluorobutylsulfonyloxy-imino)butyl]-4-biphenyl, and 2-[2,2,3,3,4,4,5,5,6,6-decafluoro-1-(nonafluorobutylsulfonyl-oxyimino)hexyl]-4-biphenyl. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy) propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1, 1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl) difluoromethanesulfonate, and 4-oxo-1-adamantyloxycarbonyldifluoromethanesulfonate.

Suitable oxime sulfonate generators using substituted acetonitrile derivatives include α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2, 4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl] acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile. Also included are modified forms of the foregoing compounds having substituted on their skeleton 2-benzoyloxy-1, 1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2- hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Suitable bisoxime sulfonates include bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Of these, the sulfonium salts, bissulfonyldiazomethanes, N-sulfonyloxyimides and oxime-O-sulfonates are preferred for sensitivity and stability.

More preferred illustrative examples of suitable sulfonium salts as the generator include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(p-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(p-toluenesulfonyl-oxy)benzenesulfonate, 4-tert-butylphenyldiphenylsulfonium camphorsulfonate, 4-tert-butylphenyldiphenylsulfonium 2,4,6-triisopropylbenzenesulfonate, tris(4-methylphenyl)sulfonium camphorsulfonate, tris(4-tert-butylphenyl)sulfonium camphorsulfonate, 10-phenylphenoxathiinium 2,4,6-triisopropylbenzenesulfonate, triphenylsulfonium trifluoromethanesulfonate, triphenylsulfonium pentafluoroethanesulfonate, triphenylsulfonium heptafluoropropanesulfonate, triphenylsulfonium nonafluorobutanesulfonate, triphenylsulfonium tridecafluorohexanesulfonate, triphenylsulfonium heptadecafluorooctanesulfonate, triphenylsulfonium perfluoro(4-ethylcyclohexane)sulfonate, 4-methylphenyldiphenylsulfonium nonafluorobutanesulfonate, 2-oxo-2-phenylethylthiacyclopentanium nonafluorobutanesulfonate, 4-tert-butylphenyldiphenylsulfonium nonafluorobutanesulfonate, 4-tert-butylphenyldiphenylsulfonium perfluoro(4-ethylcyclo-hexane)sulfonate, 4-tert-butylphenyldiphenylsulfonium heptafluorooctanesulfonate, triphenylsulfonium 1,1-difluoro-2-naphthylethanesulfonate, triphenylsulfonium 1,1,2,2-tetrafluoro-2-(norbornan-2-yl)-ethanesulfonate, triphenylsulfonium 2-benzoyloxy-1,1,3,3,3-pentafluoropropanesulfonate, triphenylsulfonium 1,1,3,3,3-pentafluoro-2-(pivaloyloxy)-propanesulfonate, triphenylsulfonium 2-(cyclohexanecarbonyloxy)-1,1,3,3,3-pentafluoropropanesulfonate, triphenylsulfonium 2-(2-naphthoyloxy)-1,1,3,3,3-pentafluoropropanesulfonate, triphenylsulfonium 2-(1-adamantanecarbonyloxy)-1,1,3,3,3-pentafluoropropanesulfonate, triphenylsulfonium 2-hydroxy-1,1,3,3,3-pentafluoropropanesulfonate, triphenylsulfonium adamantanemethoxycarbonyldifluoromethanesulfonate, triphenylsulfonium 1-(3-hydroxymethyladamantane)methoxycarbonyldifluoromethanesulfonate, triphenylsulfonium methoxycarbonyldifluoromethanesulfonate, 4-tert-butylphenyldiphenylsulfonium 2-benzoyloxy-1,1,3,3,3-pentafluoropropanesulfonate, 4-tert-butylphenyldiphenylsulfonium 1,1,3,3,3-pentafluoro-2-(pivaloyloxy)propanesulfonate, 4-tert-butylphenyldiphenylsulfonium 2-(cyclohexanecarbonyloxy)-1,1,3,3,3-pentafluoropropanesulfonate, 4-tert-butylphenyldiphenylsulfonium 2-(2-naphthoyloxy)-1,1,3,3,3-pentafluoropropanesulfonate, 4-tert-butylphenyldiphenylsulfonium 2-(1-adamantanecarbonyloxy)-1,1,3,3,3-pentafluoropropanesulfonate, 4-tert-butylphenyldiphenylsulfonium 2-hydroxy-1,1,3,3,3-pentafluoropropanesulfonate, 4-tert-butylphenyldiphenylsulfonium adamantanemethoxycarbonyldifluoromethanesulfonate, 4-tert-butylphenyldiphenylsulfonium 1-(3-hydroxymethyladamantane)methoxycarbonyldifluoromethanesulfonate, and 4-tert-butylphenyldiphenylsulfonium methoxycarbonyldifluoromethanesulfonate.

More preferred illustrative examples of suitable bissulfonyldiazomethanes include bis(tert-butylsulfonyl)diazomethane, bis(cyclohexylsulfonyl)diazomethane, bis(2,4-dimethylphenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyldiazomethane, and bis(4-tert-butylphenylsulfonyl)diazomethane.

More preferred illustrative examples of suitable N-sulfonyloxyimides include N-camphorsulfonyloxy-5-norbornene-2,3-dicarboxylic acid imide, N-p-toluenesulfonyloxy-5-norbornene-2,3-dicarboxylic acid imide, (5-(10-camphorsulfonyl)oxyimino-5H-thiophen-2-ylidene)(2-methylphenyl)acetonitrile, and (5-(p-toluenesulfonyl)oxyimino-5H-thiophen-2-ylidene)(2-methylphenyl)acetonitrile.

More preferred illustrative examples of suitable oxime-O-sulfonates include 2-oxo-2-phenylethylthiacyclopentanium 2-benzoyloxy-1,1,3,3,3-pentafluoropropanesulfonate, 2-oxo-2-phenylethylthiacyclopentanium 2-cyclohexanecarbonyloxy-1,1,3,3,3-pentafluoropropanesulfonate, triphenylsulfonium perfluoro(1,3-propylenebissulfonyl)imide, triphenylsulfonium bis(pentafluoroethylsulfonyl)imide, 2-(2,2,3,3,4,4,5,5-octafluoro-1-(nonafluorobutylsulfonyloxy-imino)pentyl)fluorene, 2-(2,2,3,3,4,4-pentafluoro-1-(nonafluorobutylsulfonyloxy-imino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(2-(cyclohexanecarbonyloxy)-1,1,3,3,3-pentafluoropropanesulfonyloxyimino)pentyl)fluorene, 2-(2,2,3,3,4,4-pentafluoro-1-(2-(cyclohexanecarbonyloxy)-1,1,3,3,3-pentafluoropropanesulfonyloxyimino)butyl)fluorene, and 2-(2,2,3,3,4,4,5,5,6,6-decafluoro-1-(nonafluorobutylsulfonyloxyimino)hexyl)fluorene.

In the chemically amplified resist composition, the photoacid generator (B) may be added in any desired amount. An appropriate amount of the photoacid generator (B) is 0.4 to 20 parts, and preferably 0.8 to 15 parts by weight per 100 parts by weight of the base resin (A). It is expected that a high sensitivity and a reduced line edge roughness are accomplished by increasing simultaneously the amounts of photoacid generator and basic compound added. More than 20 pbw of the photoacid generator may achieve little further of the sensitivity improving effect and be uneconomical. If the amount of photoacid generator is less than 0.4 pbw, the amount of the basic compound must also be reduced in order to meet the sensitivity requirement, resulting in a resist pattern having an increased roughness. Particularly when the resist film is intended for radiation irradiation or electron beam irradiation, the photoacid generator is added in higher concentrations than when excimer laser light is used, because the energy attenuation of radiation in the film by addition of the photoacid generator is negligible, but a high sensitivity is available with difficulty. Preferably, the photoacid generator is added in an amount of about 2.0 to 20 parts by weight.

The photoacid generators (B) may be used alone or in admixture of two or more. Resolution may be adjusted by combining a main photoacid generator capable of generating a main acid having a bulkiness with an auxiliary photoacid generator capable of generating an auxiliary acid having a bulkiness different from that of the main acid. For example, if the main photoacid generator is combined with the auxiliary photoacid generator capable of generating an auxiliary acid which is less bulky than the main acid from the main photoacid generator, which means that the respective acids have adjusted diffusion distances, then line edge roughness is reduced while maintaining resolution.

It is noted that an acid diffusion controlling function may be provided when two or more photoacid generators are used in admixture provided that one photoacid generator is an onium salt capable of generating a weak acid. Specifically, in a system using a mixture of a photoacid generator capable of generating a strong acid (e.g., fluorinated sulfonic acid) and an onium salt capable of generating a weak acid (e.g., non-fluorinated sulfonic acid or carboxylic acid), if the strong acid generated from the photoacid generator upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If an onium salt capable of generating a strong acid and an onium salt capable of generating a weak acid are used in admixture, an exchange from the strong acid to the weak acid as above can take place, but it never happens that the weak acid collides with the unreacted onium salt capable of generating a strong acid to induce a salt exchange. This is because of a likelihood of an onium cation forming an ion pair with a stronger acid anion.

Component C

Component (C) in the resist film is one or more basic compound which is referred to as "quencher." The term "quencher" is commonly used in the art as meaning a compound capable of suppressing the rate of diffusion when the acid generated by the acid generator diffuses within the resist film. The inclusion of quencher facilitates to adjust the resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). One suitable nitrogen-containing compound with sulfonyl group is 3-pyridinesulfonic acid. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-tert-butoxycarbonyl-N,N-dicyclohexylamine, N-tert-butoxycarbonylbenzimidazole, and oxazolidinone.

Suitable ammonium salts include pyridinium p-toluenesulfonate, triethylammonium p-toluenesulfonate, trioctylammonium p-toluenesulfonate, triethylammonium 2,4,6-triisopropylbenzenesulfonate, trioctylammonium 2,4,6-triisopropylbenzenesulfonate, triethylammonium camphorsulfonate, trioctylammonium camphorsulfonate, tetramethylammonium hydroxide, tetraethylammonium hydroxide, tetrabutylammonium hydroxide, benzyltrimethylammonium hydroxide, tetramethylammonium p-toluenesulfonate, tetrabutylammonium p-toluenesulfonate, benzyltrimethylammonium p-toluenesulfonate, tetramethylammonium camphorsulfonate, tetrabutylammonium camphorsulfonate, benzyltrimethylammonium camphorsulfonate, tetramethylammonium 2,4,6-triisopropylbenzenesulfonate, tetrabutylammonium 2,4,6-triisopropylbenzenesulfonate, benzyltrimethylammonium 2,4,6-triisopropylbenzenesulfonate, tetramethylammonium acetate, tetrabutylammonium acetate, benzyltrimethylammonium acetate, tetramethylammonium benzoate, tetrabutylammonium benzoate, and benzyltrimethylammonium benzoate.

In addition, amine compounds of the following general formula (B)-1 may also be included alone or in admixture.

$$N(X)_n(Y)_{3-n} \quad \quad \quad (B)\text{-}1$$

In the formula, n is equal to 1, 2 or 3. X is independently selected from groups of the following general formulas (X)-1 to (X)-3. Y is independently hydrogen or a straight, branched or cyclic $C_1$-$C_{20}$ alkyl group in which some or all hydrogen atoms may be substituted by fluorine atoms and which may contain an ether or hydroxyl group. Two or three X may bond together to form a ring.

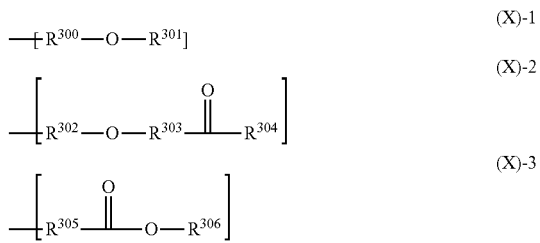

In the formulas, $R^{300}$, $R^{302}$ and $R^{305}$ are independently straight or branched $C_1$-$C_4$ alkylene groups. $R^{301}$ and $R^{304}$ are independently hydrogen or straight, branched or cyclic $C_1$-$C_{20}$ alkyl groups in which some or all hydrogen atoms may be substituted by fluorine atoms and which may contain at least one hydroxyl group, ether group, ester group or lactone ring. $R^{303}$ is a single bond or a straight or branched $C_1$-$C_4$ alkylene group. $R^{306}$ is a straight, branched or cyclic $C_1$-$C_{20}$ alkyl group in which some or all hydrogen atoms may be substituted by fluorine atoms and which may contain at least one hydroxyl group, ether group, ester group or lactone ring.

Illustrative examples of the compounds of formula (B)-1 include, but are not limited to, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris (2-valeryloxyethyl)amine, tris(2-pivaloyloxyethyl)amine, N,N-bis(2-acetoxyethyl)-2-(acetoxyacetoxy)ethylamine, tris (2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

Also useful are one or more of cyclic structure-bearing amine compounds having the following general formula (B)-2.

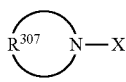

(B)-2

Herein X is as defined above, and $R^{307}$ is a straight or branched $C_2$-$C_{20}$ alkylene group in which some or all hydrogen atoms may be substituted by fluorine atoms and which may contain one or more carbonyl, ether, ester or sulfide groups.

Illustrative examples of the cyclic structure-bearing amine compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-[2-(2-methoxyethoxy)ethoxy]ethylmorpholine, 2-[2-(2-butoxyethoxy)ethoxy]ethylmorpholine, 2-{2-[2-(2-methoxyethoxy)ethoxy]ethoxy}ethylmorpholine, 2-{2-[2-(2-butoxyethoxy)ethoxy]ethoxy}ethylmorpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, and 2-morpholinoethyl adamantanecarboxylate.

Also, one or more of cyano-bearing amine compounds having the following general formulae (B)-3 to (B)-6 may be added.

(B)-3

(B)-4

(B)-5

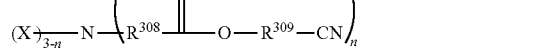

(B)-6

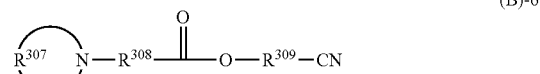

Herein, X, $R^{307}$ and n are as defined in formula (B)-1, and $R^{308}$ and $R^{309}$ are each independently a straight or branched $C_1$-$C_4$ alkylene group.

Illustrative examples of the cyano-bearing amine compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are amine compounds having an imidazole structure and a polar functional group, represented by the general formula (B)-7.

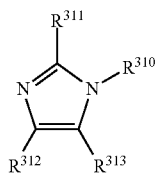

(B)-7

Herein, $R^{310}$ is a straight, branched or cyclic $C_2$-$C_{20}$ alkyl group in which some or all hydrogen atoms may be substituted by fluorine atoms and which has one or more polar functional groups. The polar functional group is selected from among hydroxyl, carbonyl, ester, ether, sulfide, carbonate, cyano and acetal groups and mixtures thereof. $R^{311}$, $R^{312}$ and $R^{313}$ are each independently a hydrogen atom, a straight, branched or cyclic $C_1$-$C_{10}$ alkyl group, aryl group or aralkyl group.

Also included are amine compounds having a benzimidazole structure and a polar functional group, represented by the general formula (B)-8.

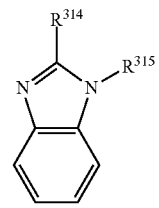

(B)-8

Herein, $R^{314}$ is a hydrogen atom, a straight, branched or cyclic $C_1$-$C_{10}$ alkyl group, aryl group or aralkyl group. $R^{315}$ is a straight, branched or cyclic $C_1$-$C_{20}$ alkyl group in which some or all hydrogen atoms may be substituted by fluorine atoms and which has one or more polar functional groups. The alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

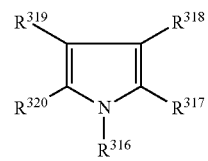

(B)-9

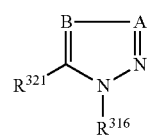

(B)-10

Herein, A is a nitrogen atom or $\equiv$C—$R^{322}$. B is a nitrogen atom or $\equiv$C—$R^{323}$. $R^{316}$ is a straight, branched or cyclic $C_2$-$C_{20}$ alkyl group in which some or all hydrogen atoms may be substituted by fluorine atoms and which has one or more polar functional groups, the polar functional group being selected from among hydroxyl, carbonyl, ester, ether, sulfide, carbonate, cyano and acetal groups and mixtures thereof. $R^{317}$, $R^{318}$, $R^{319}$, $R^{320}$ are each independently a hydrogen atom, a straight, branched or cyclic $C_1$-$C_{10}$ alkyl group or aryl group, or a pair of $R^{317}$ and $R^{318}$ and a pair of $R^{319}$ and $R^{320}$, taken together, may form a benzene, naphthalene or pyridine ring. $R^{321}$ is a hydrogen atom, a straight, branched or cyclic $C_1$-$C_{10}$ alkyl group or aryl group. $R^{322}$ and $R^{323}$ each are a hydrogen atom, a straight, branched or cyclic $C_1$-$C_{10}$ alkyl group or aryl group. $R^{321}$ and $R^{323}$ may bond together to form a benzene or naphthalene ring.

Also included are amine compounds having an aromatic carboxylic acid ester structure, represented by the general formulae (B)-11 to (B)-14.

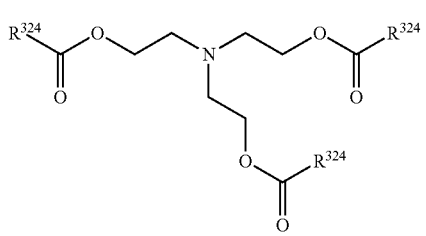
(B)-11

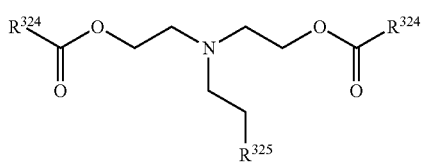
(B)-12

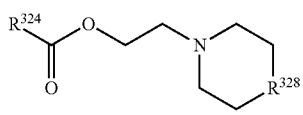
(B)-13

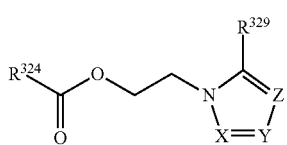
(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is —$CO_2R^{326}$, —$OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. X is a nitrogen atom or =$CR^{330}$. Y is a nitrogen atom or =$CR^{331}$. Z is a nitrogen atom or =$CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring.

Further included are amine compounds of 7-oxanorbornane-2-carboxylic ester structure, represented by the general formula (B)-15.

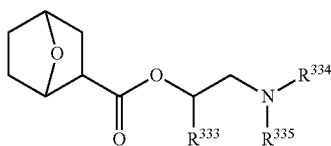
(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, carbonyloxy, alcoholic hydroxyl, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms.

The basic compound or quencher is preferably formulated in an amount of 0.001 to 2 parts, and especially 0.01 to 1 part by weight, per 100 parts by weight of the entire base resin (A). Less than 0.001 phr of the quencher may achieve no addition effect whereas more than 2 phr may lead to too low a sensitivity.

Other Components

In the resist composition solution used in forming the resist film, a surfactant commonly used for improving coating characteristics may be added as an optional component. It is noted that optional components such as surfactants may be added in ordinary amounts as long as they do not compromise the object of the invention.

The preferred surfactants are nonionic surfactants, for example, perfluoroalkyl polyoxyethylene ethanols, fluorinated alkyl esters, perfluoroalkylamine oxides, perfluoroalkyl EO addition products, and fluorinated organosiloxane compounds. Suitable surfactants are commercially available, including Fluorad FC-430 and FC-431 (Sumitomo 3M Co., Ltd.), Surflon S-141, S-145, KH-10, KH-20, KH-30 and KH-40 (Asahi Glass Co., Ltd.), Unidyne DS-401, DS-403 and DS-451 (Daikin Industries, Ltd.), Megaface F-8151 (Dai-Nippon Ink & Chemicals, Inc.), and X-70-092 and X-70-093 (Shin-Etsu Chemical Co., Ltd.). Inter alia, Fluorad FC-430, KH-20, KH-30, and X-70-093 are preferred.

In the resist film, a carboxylic acid compound may be added if necessary. The carboxylic acid compound which can be added to the resist composition solution used in forming the resist film is at least one compound selected from Groups I and II below, but not limited thereto. Including this compound improves the post-exposure delay (PED) stability of the resist and ameliorates edge roughness on nitride film substrates.

Group I:

Compounds in which some or all of the hydrogen atoms on the phenolic hydroxyl groups of the compounds of general formulas (A1) to (A10) below are replaced by —$R^{401}$—COOH (wherein $R^{401}$ is a straight or branched $C_1$-$C_{10}$ alkylene group), and in which the molar ratio C/(C+D) of phenolic hydroxyl groups [C] to ≡C—COOH groups [D] in the molecule is from 0.1 to 1.0.

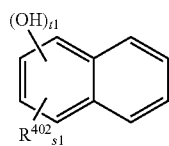
(A1)

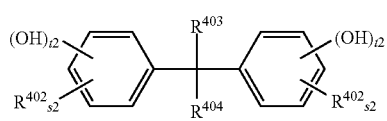
(A2)

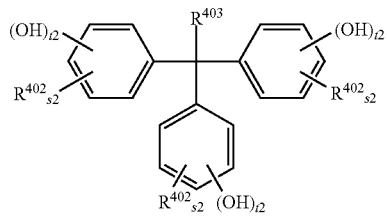
(A3)

-continued

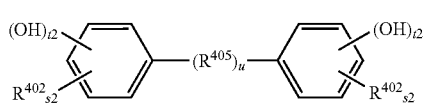
(A4)

(A5)

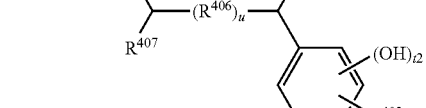
(A6)

(A7)

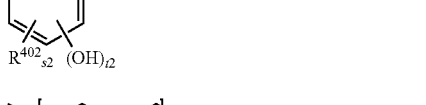
(A8)

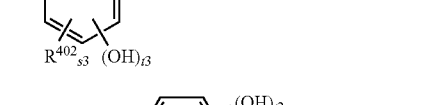
(A9)

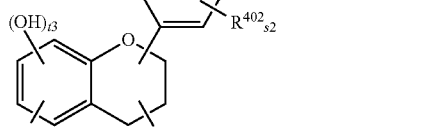
(A10)

In these formulas, $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{408}$ is hydrogen or methyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; the letter j is an integer from 0 to 3; u is an integer from 1 to 4; h is an integer from 1 to 4; s1, t1, s2, t2, s3, t3, s4, and t4 are each integers which satisfy s1+t1=8, s2+t2=5, s3+t3=4, and s4+t4=6, and are such that each phenyl structure has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

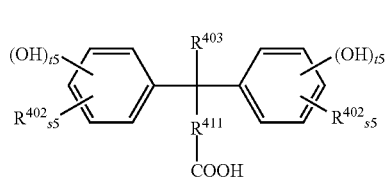
(A11)

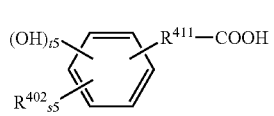
(A12)

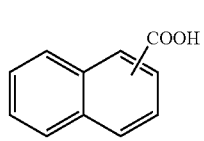
(A13)

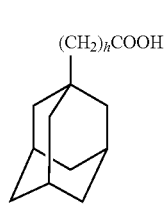
(A14)

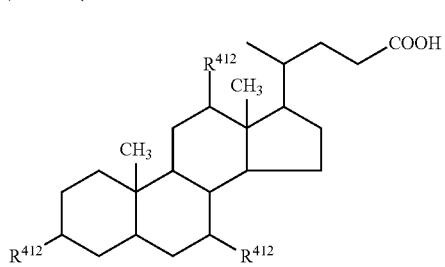
(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h is an integer from 1 to 4.

Illustrative, non-limiting examples of the compound having a carboxyl group include compounds of the general formulas AI-1 to AI-14 and AII-1 to AII-10 below.

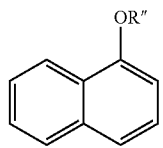
(AI-1)

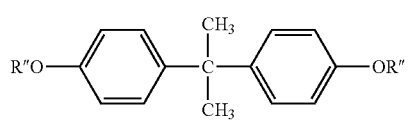 (AI-2)
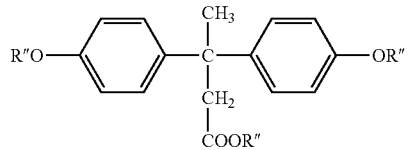 (AI-3)
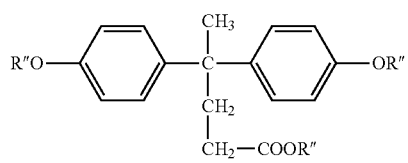 (AI-4)
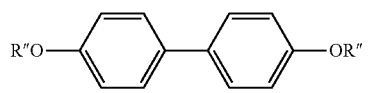 (AI-5)
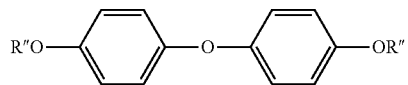 (AI-6)
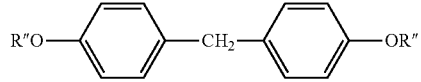 (AI-7)
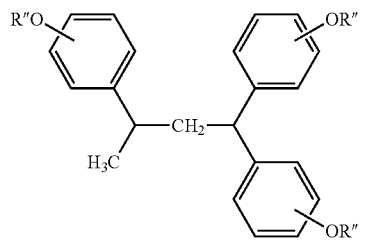 (AI-8)
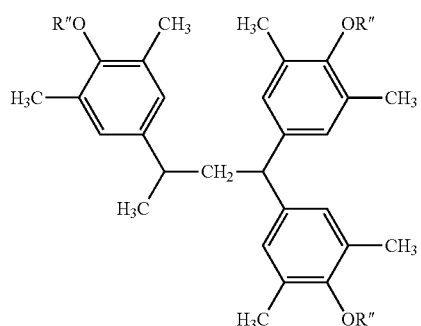 (AI-9)
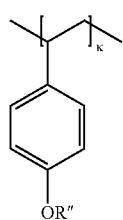 (AI-10)
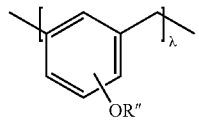 (AI-11)
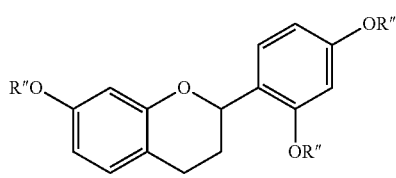 (AI-12)
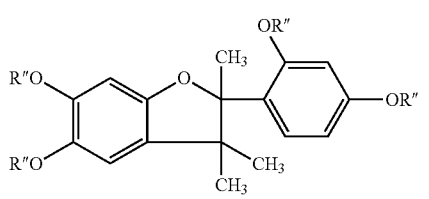 (AI-13)
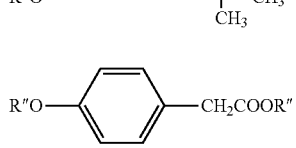 (AI-14)
In the above formulas, R" is hydrogen or a —CH$_2$COOH group such that the —CH$_2$COOH group accounts for 10 to 100 mol % of R" in each compound, κ and λ, are as defined above.
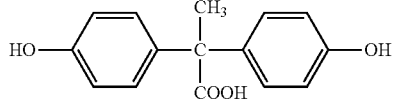 (AII-1)
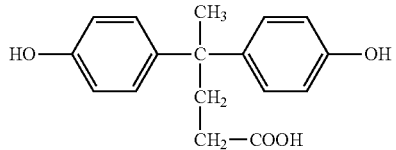 (AII-2)
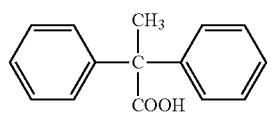 (AII-3)
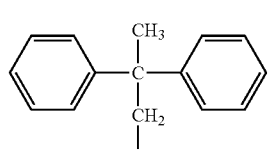 (AII-4)
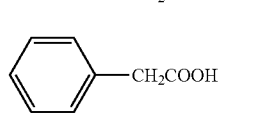 (AII-5)
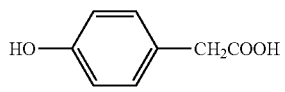 (AII-6)

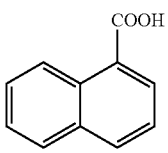 (AII-7)

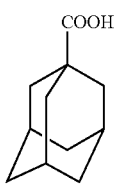 (AII-8)

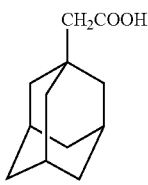 (AII-9)

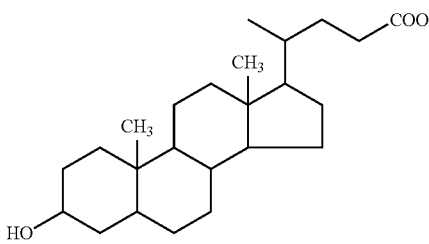 (AII-10)

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, further preferably 0.1 to 2 parts by weight, per 100 parts by weight of the base resin. Up to 5 pbw of the compound has a minimized risk of reducing the resolution of the resist composition.

In preparing the resist composition solution for forming the resist film, an acetylene alcohol derivative may be added for improving the shelf stability and film formation by coating of the composition solution. The preferred acetylene alcohol derivatives include those having the general formula (S1) or (S2) below.

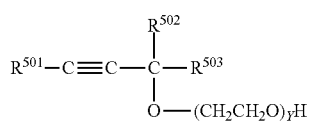 (S1)

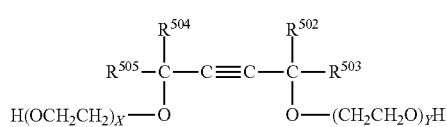 (S2)

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is preferably added in an amount of 0.01 to 2% by weight, and more preferably 0.02 to 1% by weight of the resist composition. At least 0.01 wt % of the derivative is fully effective for improving coating characteristics and shelf stability whereas up to 2 wt % of the derivative has a minimized risk of reducing the resolution of the resist composition.

To enable formation of a resist film from the resist composition containing the aforementioned components, the composition is made a solution by adding an organic solvent. The organic solvent used herein may be any organic solvent in which components (A) to (D) and additives are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, ethyl lactate, and mixtures thereof because the acid generator is most soluble therein.

An appropriate amount of the organic solvent used is about 200 to 3,000 parts, especially about 400 to 2,500 parts by weight per 100 parts by weight of the base resin (A).

Process

The above-described components are dissolved in a solvent to form a resist composition solution which is filtered and then applied to a workpiece to form a resist film thereon. Typical of the workpiece is a processable substrate, for example, a photomask blank in which a photomask substrate (e.g., transparent quartz substrate) is covered with a suitable film, typically a light-shielding film containing a metal (e.g., transition metal or silicon) and optionally at least one light element selected from oxygen, nitrogen and carbon. The resist composition solution is applied to the processable substrate so as to give a dry coating of 0.05 to 2.0 μm thick by any of well-known application techniques including spin coating, roll coating, flow coating, dip coating, spray coating, and doctor coating. The coating is prebaked on a hot plate at 60 to 150° C. for 30 seconds to 20 minutes, and preferably at 80 to 140° C. for 5 to 15 minutes in the case of photomask blanks, for removing the unnecessary solvent, yielding the resist film.

The resist film containing component (D) has the advantage that it is amenable to the lithography of irradiating high-energy radiation to a resist film in the absence of liquid. Examples of the high-energy radiation include electron beam, x-ray, excimer laser light, γ-ray, and synchrotron radiation. Of course, advantages are obtained in the lithography using a photomask. The resist film is particularly advantageous when combined with such lithography processes as irradiation in vacuum and irradiation of high-energy beam, but excluding the immersion lithography. A typical lithography process is electron beam irradiation.

The process of forming a resist pattern by exposing the resist film to a pattern of radiation, followed by post treatment and development is known from numerous publications including the patents cited herein. The process of the invention may be carried out in accordance with these teachings.

For example, in the processing of a photomask blank using an electron beam, a resist film is deposited on a photomask blank by the above-mentioned procedure. Thereafter, using an electron beam exposure system, an electron beam is irradiated to the region of the resist film where the underlying film such as a light-shielding film is to be removed. While the exposure dose may be adjusted as appropriate by controlling the amounts of photoacid generator and basic compound added, as pointed out above, an exposure dose of about 0.1 to 20 μC/cm² is generally preferred, with an exposure dose of about 3 to 10 μC/cm² being more preferred.

After the pattern exposure, the photomask blank is heated or post-exposure baked (PEB) on a hot plate at 60 to 150° C. for about 1 to 20 minutes, and preferably at 80 to 120° C. for about 1 to 10 minutes.

This is followed by development using an aqueous alkaline developer. Development is typically carried out in an aqueous solution of 0.1 to 5 wt %, preferably 2 to 3 wt % tetramethylammonium hydroxide (TMAH) for 0.1 to 3 minutes, preferably 0.5 to 2 minutes by a conventional technique such as dip, puddle or spray technique. In this way, a desired resist pattern is formed. Since the resist film having a large contact angle with water is on the mask blank, uniform development is achieved, resulting in improved in-plane uniformity of line width at the end of development.

The procedure of forming a resist pattern on a photomask blank by the resist pattern forming process of the invention is fully compliant with spray development commonly used in the mask manufacture, achieving high in-plane uniformity over the prior art.

The photomask blank having the resist pattern formed thereon may then be processed into a photomask by wet etching or dry etching. The dry etching is preferred because a photomask with a higher accuracy is obtainable. With respect to the dry etching of photomask blanks, a number of patents and publications are known, for example, JP-A 2006-078807 and JP-A 2006-146151. To a chromium compound film, for example, dry etching with oxygen-containing chlorine gas is generally applied. To films of silicon compounds, transition metal-containing silicon compounds and tantalum compounds, dry etching with fluorine gas is generally applied.

EXAMPLE

Examples and Comparative Examples are given below by way of illustration and not by way of limitation.
Preparation of Polymers Polymers or polymeric additives as component (D) to be added to resist compositions were synthesized by a process including selection of suitable monomers, copolymerization in isopropyl alcohol medium, crystallization in hexane, repeated washing with hexane, isolation, and drying. The composition of these polymers was analyzed by ¹H-NMR, and the weight average molecular weight (Mw) and dispersity (Mw/Mn) determined by gel permeation chromatography (GPC).

Polymer 1

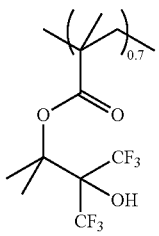 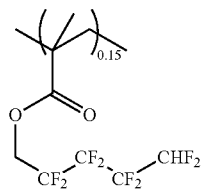

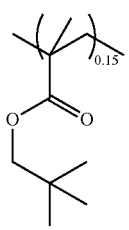

Mw = 7,300
Mw/Mn = 1.67

Polymer 2

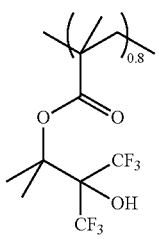 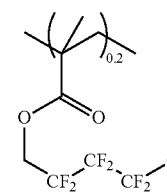

Mw = 7,600
Mw/Mn = 1.62

Polymer 3

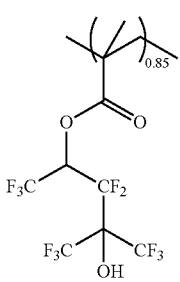 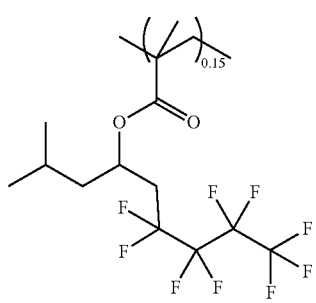

Mw = 9,300
Mw/Mn = 1.93

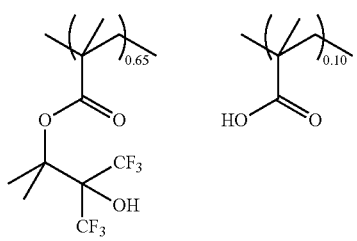

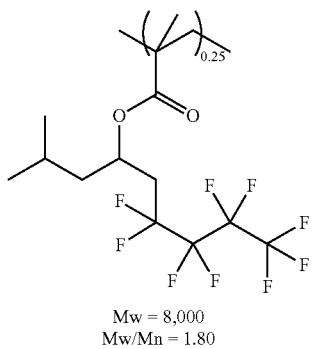

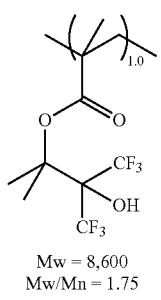

Mw = 8,000
Mw/Mn = 1.80

Mw = 8,600
Mw/Mn = 1.75

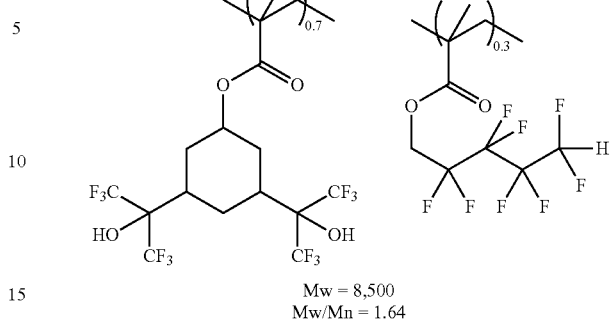

Mw = 8,500
Mw/Mn = 1.64

Preparation of Resist Compositions

Resist compositions were prepared in accordance with the formulation shown in Table 1. The values in Table 1 are expressed in parts by weight (pbw). The components shown in Table 1 are identified below.

Polymers 1 to 6: as described above
Polymer 7: hydroxystyrene-4-(1-methoxy-2-methoxy)-hydroxystyrene copolymer
Polymer 8: hydroxystyrene-acetoxystyrene-4-(1-methoxy-2-methoxy)hydroxystyrene copolymer
Polymer 9: hydroxystyrene-indene-4-(dicyclopentyloxyethoxy)hydroxystyrene copolymer
PAG1: triphenylsulfonium toluenesulfonate
PAG2: triphenylsulfonium 1,3,5-triisopropyl-sulfonate
PAG3: (4-tert-butoxyphenyl)diphenylsulfonium mesitylene-sulfonate
PAG4: (n-butylsulfonyl)-5-norbornene-2,3-dicarboxylic imide
Base 1: tris[2-(methoxymethoxy)ethyl]amine
Base 2: tri-n-butylamine
Surfactant 1: FC-430 (Sumitomo 3M Co., Ltd.)
Surfactant 2: KH-20 (Asahi Glass Co., Ltd.)
Solvent 1: propylene glycol methyl ether acetate
Solvent 2: ethyl lactate

TABLE 1

| | Example | | | | | | | | | | Comparative Example | | | | |
|---|---|---|---|---|---|---|---|---|---|---|---|---|---|---|---|
| | 1 | 2 | 3 | 4 | 5 | 6 | 7 | 8 | 9 | 10 | 1 | 2 | 3 | 4 | 5 |
| Polymer 1 | 5 | | | | | | 5 | | | | | | | | |
| Polymer 2 | | 5 | | | | | | | 5 | | | | | | |
| Polymer 3 | | | 5 | | | | | 5 | | | | | | | |
| Polymer 4 | | | | 5 | | | | | | 5 | | | | | |
| Polymer 5 | | | | | 5 | | | | | | | | | | |
| Polymer 6 | | | | | | 5 | | | | | | | | | |
| Polymer 7 | 80 | 80 | 80 | 80 | 80 | 80 | | | | | 80 | | | | |
| Polymer 8 | | | | | | | | 80 | | | | 80 | | | |
| Polymer 9 | | | | | | | 80 | | 80 | 80 | | | 80 | 80 | 80 |
| PAG1 | 6 | 6 | 6 | 6 | 6 | 6 | 6 | 6 | | | 6 | 6 | 6 | | |
| PAG2 | 2 | 2 | 2 | 2 | 2 | 2 | 2 | 2 | 6 | | 2 | 2 | 2 | 6 | |
| PAG3 | | | | | | | | | 2 | 6 | | | | 2 | 6 |
| PAG4 | | | | | | | | | | 2 | | | | | 2 |
| Base 1 | 0.4 | 0.4 | 0.4 | 0.4 | 0.4 | 0.4 | | | | 0.4 | | | | | |
| Base 2 | | | | | | | 0.4 | 0.4 | 0.4 | 0.4 | | 0.4 | 0.4 | 0.4 | 0.4 |
| Surfactant 1 | 0.2 | 0.2 | 0.2 | 0.2 | 0.2 | 0.2 | | | | | 0.2 | 0.2 | | | |
| Surfactant 2 | | | | | | | 0.2 | 0.2 | 0.1 | 0.1 | | | 0.2 | 0.1 | 0.1 |
| Solvent 1 | 650 | 650 | 650 | 650 | 650 | 650 | 870 | 650 | 430 | 870 | 650 | 870 | 650 | 430 | 870 |
| Solvent 2 | 650 | 650 | 650 | 650 | 650 | 650 | 430 | 650 | 870 | 430 | 650 | 430 | 650 | 870 | 430 |

The resist compositions was filtered through a 0.2-μm fluoroplastic filter. For the evaluation of a contact angle with pure water, optimum exposure (sensitivity Eop) and maximum resolution of the resist composition, the resist solution was spin coated on a silicon wafer having CrON (4:5:1) deposited on its surface as a photomask blank model, to a buildup of 0.3 μm. The coated silicon wafer was baked on a hot plate at 110° C. for 4 minutes.

While the wafer having the photoresist film formed thereon was kept horizontal, 50 μm of ultra-pure water was dripped onto the resist film to form a water droplet. A contact angle was measured by a contact angle meter FACECA-X150 (Kyowa Interface Science Co., Ltd.). The results are shown in Table 2.

The resist film was exposed to electron beam using an EB exposure system HL-800 D (Hitachi High-Technologies Corp., accelerating voltage 50 keV), then baked (PEB) at 110° C. for 4 minutes, and developed with an aqueous solution of 2.38 wt % tetramethylammonium hydroxide, thereby giving a positive pattern. The sample was cut, and the section was observed under a scanning electron microscope (SEM). The optimum exposure dose (sensitivity Eop) was the exposure dose which provided a 1:1 resolution at the top and bottom of a 0.40-μm line-and-space pattern. The minimum line width (μm) of a line-and-space pattern which was ascertained separate on the wafer when processed at the optimum dose (Eop) was the maximum resolution of a test resist. The results are also shown in Table 2.

Next, as a typical photomask blank for ArF lithography mask, a photomask blank was prepared by depositing a CrN light-shielding film (Cr:N=9:1 in atom ratio) of 26 nm thick and a CrON antireflective film (Cr:O:N=4:5:1 in atom ratio) of 20 nm thick on a synthetic quartz substrate of 6 inches square. The resist composition was spin coated onto the photomask blank at 1500 rpm by a mask resist coater (Sigmameltec Ltd.). The coating was prebaked on a hot plate at 110° C. for 10 minutes, forming a resist film of 0.3 μm thick.

Using the EB exposure system, the resist film was exposed to a pattern including 49 similar zones in 7 rows×7 columns located within its plane as a model pattern. The film was baked (PEB) at 110° C. for 10 minutes and developed with an aqueous solution of 2.38 wt % tetramethylammonium hydroxide, thereby giving a positive pattern.

The resist pattern was observed from the top under an SEM. For the 49 zones, the range of variation of the line width of a line-and-space pattern corresponding to 0.40 μm at Eop was determined and reported as CD uniformity. The results are shown in Table 2. It is noted that the Eop in this experiment did not differ from the value obtained with the wafer used as the photomask blank model.

TABLE 2

|  | Eop, $\mu C/cm^2$ | Maximum resolution, nm | Contact angle, ° | CD uniformity, nm |
| --- | --- | --- | --- | --- |
| Example 1 | 9.3 | 105 | 86.3 | 7.1 |
| Example 2 | 9.0 | 100 | 87.0 | 6.9 |
| Example 3 | 9.2 | 110 | 88.8 | 5.9 |
| Example 4 | 8.8 | 120 | 87.5 | 7.2 |
| Example 5 | 8.5 | 120 | 87.9 | 7.3 |
| Example 6 | 8.6 | 115 | 80.1 | 8.8 |
| Example 7 | 10.6 | 90 | 77.7 | 10.9 |
| Example 8 | 9.8 | 120 | 78.1 | 9.9 |
| Example 9 | 9.6 | 80 | 85.3 | 5.6 |
| Example 10 | 12.1 | 100 | 79.1 | 8.1 |
| Comparative Example 1 | 9.0 | 110 | 76.1 | 9.8 |
| Comparative Example 2 | 10.3 | 95 | 72.7 | 12.2 |
| Comparative Example 3 | 9.8 | 120 | 71.6 | 10.2 |
| Comparative Example 4 | 10.9 | 90 | 71.6 | 7.7 |
| Comparative Example 5 | 12.1 | 100 | 75.5 | 11.0 |

It is seen from Table 2 that as compared with Comparative Example 1 which is free of component (D), those resist films having Polymers 1 to 6 added as component (D) have a large contact angle with neutral water and are improved in in-plane uniformity of line width (CD uniformity). Similar results are obtained when the base resin as component (A) is changed from Polymer 7 to Polymer 8 or 9. That is, a comparison between Example 7 and Comparative Example 2 and between Example 8 and Comparative Example 3 reveals that those resist films having component (D) show a large contact angle and improved CD uniformity. Although a change of photoacid generator has a possibility to affect CD uniformity, a comparison between Example 9 and Comparative Example 4 and between Example 10 and Comparative Example 5, in which photoacid generators different from those in Examples 1 to 8 are used, reveals that those resist films having component (D) also show a large contact angle and improved CD uniformity.

Better results are obtained when lithography is applied to the chemically amplified positive resist compositions comprising component (D). That is, CD uniformity is improved due to a large contact angle of resist films, which is attributable to the polymer as component (D), while maintaining sensitivity and maximum resolution, as compared with component (D)-free resist films.

Japanese Patent Application No. 2007-150130 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A process for forming a resist pattern using a workpiece having a resist film deposited thereon,
said resist film comprising
(A) a base resin which is insoluble in an aqueous alkaline solution, but turns to be soluble in an aqueous alkaline developer under the action of an acid,
(B) an acid generator,
(C) a basic compound, and
(D) a polymer comprising first recurring units having a side chain having a first fluorinated hydrocarbon group bearing a hydroxyl group which contains the carbon atom to which the hydroxyl group is bonded and vicinal carbon atoms bonded thereto, the vicinal carbon atoms having in total at least two fluorine atoms bonded thereto, wherein
the base resin (A) comprises recurring units having an aromatic structure,
the polymer (D) functions such that the contact angle with neutral water of a resist film comprising components (A)

to (D) is larger than the contact angle of a resist film comprising components (A) to (C) and free of component (D), the first recurring units of the polymer (D) have the general formula (1) or (2):

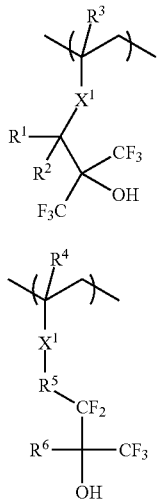

wherein $R^1$ and $R^2$ are each independently hydrogen or a straight, branched or cyclic $C_1$-$C_6$ alkyl group, or $R^1$ and $R^2$ may bond together to form a ring, a combination of $R^1$ and $R^2$ standing for a divalent organic group of 2 to 12 carbon atoms in total, $R^3$ and $R^4$ are each independently hydrogen or methyl, $R^5$ is a straight, branched or cyclic $C_1$-$C_6$ alkylene group in which at least one hydrogen atom may be substituted by a fluorine atom, $R^6$ is independently a straight or branched $C_1$-$C_{10}$ alkyl group in which at least one hydrogen atom is substituted by a fluorine atom, or $R^5$ and $R^6$ may bond together to form a ring, a combination of $R^5$ and $R^6$ standing for a trivalent organic group of 2 to 12 carbon atoms in total, and $X^1$ is —C(=O)—, —C(=O)—O—, —O—, —C(=O)—$R^7$—C(=O)—, or —C(=O)—O—$R^7$—C(=O)—O— wherein $R^7$ is a straight, branched or cyclic $C_1$-$C_{10}$ alkylene group, the polymer (D) further comprises second recurring units having a side chain having a second fluorinated hydrocarbon group different from the first fluorinated hydrocarbon group and free of the first fluorinated hydrocarbon group, the second recurring units of the polymer (D) have the general formula (3):

wherein $R^8$ is independently hydrogen or methyl, $R^9$ is a straight, branched or cyclic $C_1$-$C_{10}$ alkyl group in which at least one hydrogen atom is substituted by a fluorine atom, and $X^2$ is —C(=O)—, —C(=O)—O—, —O—, —C(=O)—$R^{10}$—C(=O)—, or —C(=O)—O—$R^{10}$—C(=O)—O— wherein $R^{10}$ is a straight, branched or cyclic $C_1$-$C_{10}$ alkylene group, the polymer (D) further comprises another recurring unit different from the first and second recurring units, in an amount of up to 20 mol % based on the entire recurring units of the polymer (D), and the resist film contains 0.1 to 10 parts by weight of the polymer (D) per 100 parts by weight of the component (A), said process comprising the steps of irradiating high-energy radiation to the resist film in the absence of a liquid, and developing the resist film with an aqueous alkaline developer.

2. The process of claim 1 wherein the high-energy radiation is a high-energy beam.

3. The process of claim 2 wherein the high-energy radiation is an electron beam.

4. A process for preparing a photomask, comprising the steps of forming a resist pattern in accordance with the process of claim 1 wherein the workpiece is a photomask blank, and etching the photomask blank through the resist pattern as an etching mask.

5. The process of claim 1 wherein the polymer (D) includes main recurring units in which atoms forming the polymerized main chain are not part of a cyclic structure.

6. The process of claim 1 wherein the second recurring units are used so that the molar ratio of second recurring units to first recurring units is up 30/70.

* * * * *